(12) United States Patent
Bickel et al.

(10) Patent No.: US 11,994,543 B2
(45) Date of Patent: May 28, 2024

(54) SYSTEMS AND METHODS FOR IMPROVING IDENTIFICATION OF ISSUES ASSOCIATED WITH DETECTING ANOMALOUS CONDITIONS

(71) Applicant: Schneider Electric USA, Inc., Andover, MA (US)

(72) Inventors: Jon A. Bickel, Murfreesboro, TN (US); Colton Thomas Peltier, Murfreesboro, TN (US)

(73) Assignee: Schneider Electric USA, Inc., Andover, MA (US)

( * ) Notice: Subject to any disclaimer, the term of this patent is extended or adjusted under 35 U.S.C. 154(b) by 94 days.

(21) Appl. No.: 17/221,072

(22) Filed: Apr. 2, 2021

(65) Prior Publication Data
US 2022/0196710 A1  Jun. 23, 2022

Related U.S. Application Data

(60) Provisional application No. 63/162,321, filed on Mar. 17, 2021, provisional application No. 63/127,257, filed on Dec. 18, 2020.

(51) Int. Cl.
| | |
|---|---|
| *G01R 19/25* | (2006.01) |
| *G01R 19/12* | (2006.01) |
| *G01R 19/14* | (2006.01) |

(52) U.S. Cl.
CPC ......... *G01R 19/2509* (2013.01); *G01R 19/12* (2013.01); *G01R 19/14* (2013.01); *G01R 19/2513* (2013.01)

(58) Field of Classification Search
CPC .... G01R 19/2509; G01R 19/12; G01R 19/14; G01R 19/2513; G01R 31/08; G01R 31/00; G06F 30/20; G06F 2111/04
See application file for complete search history.

(56) References Cited

U.S. PATENT DOCUMENTS

2009/0254291 A1* 10/2009 Benmouyal ........ G01R 19/2509
702/75
2016/0077150 A1* 3/2016 Schweitzer, III .... G01R 31/085
307/125

(Continued)

FOREIGN PATENT DOCUMENTS

| WO | 2019195520 A1 | 10/2019 | |
|---|---|---|---|
| WO | WO-2019195520 A1 * | 10/2019 | ......... G01R 19/2509 |

OTHER PUBLICATIONS

Extended European Search Report dated May 27, 2022 for corresponding European Patent Application No. 21211787.3-1001, 5 pages.

*Primary Examiner* — Catherine T. Rastovski
*Assistant Examiner* — Yossef Korang-Beheshti
(74) *Attorney, Agent, or Firm* — Locke Lord LLP

(57) ABSTRACT

Provided is a system and method to automatically identify metering constraints of one or more IEDs in an electrical system, which include capturing at least one energy-related waveform using at least one of the IEDs in the electrical system, and processing electrical measurement data from, or derived from, the at least one energy-related waveform to identify anomalous characteristics in the electrical system. In response to identifying anomalous characteristics in the electrical measurement data, an event constraint model is built based on or by using the identified anomalous characteristics. Once built, the event constraint model is analyzed to determine if the at least one energy-related waveform is being adequately captured by the at least one of the IEDs. In response to determining the at least one energy-related waveform is not adequately captured, one or more actions may be taken to address the capturing inadequacy.

26 Claims, 9 Drawing Sheets

(56) References Cited

U.S. PATENT DOCUMENTS

| | | | |
|---|---|---|---|
| 2017/0195362 A1* | 7/2017 | Schweitzer, III | G06F 11/0793 |
| 2020/0011903 A1 | 1/2020 | Menzel et al. | |
| 2020/0166559 A1* | 5/2020 | Dzienis | G01R 31/088 |
| 2020/0393501 A1 | 12/2020 | Menzel et al. | |
| 2021/0293873 A1* | 9/2021 | Sun | G01R 31/52 |

* cited by examiner

FIG. 4A (known art)

SYSTEMS AND METHODS FOR IMPROVING IDENTIFICATION OF ISSUES ASSOCIATED WITH DETECTING ANOMALOUS CONDITIONS

CROSS REFERENCE TO RELATED APPLICATION

This application claims the benefit of and priority to U.S. Provisional Application No. 63/127,257, filed on Dec. 18, 2020, and U.S. Provisional Application No. 63/162,321, filed on Mar. 17, 2021, which applications were filed under 35 U.S.C. § 119(e) and are incorporated by reference herein in their entirety.

FIELD

This disclosure relates generally to electrical/power systems, and more particularly, to systems and methods for improving identification of issues associated with detecting anomalous conditions (e.g., electrical transient voltages) in electrical systems.

BACKGROUND

As is known, electrical transient voltages can originate inside an energy consumer's facility or out on the utility's grid and can propagate through various levels of electrical and data systems. Sources of destructive transient voltages can range from the obvious—such as a lightning stroke during a thunderstorm—to the subtle—such as static discharge from a human finger.

Transient overvoltages that exceed insulation ratings can stress electrical insulation, leading to gradual breakdown or abrupt failure of the dielectric. It is not uncommon for an industrial facility to experience many transients every hour with voltage impulses exceeding five to ten times the nominal system voltage. Reducing the magnitude and duration of voltage transients can extend the life of equipment insulation resulting in longer equipment operational life.

Because damage due to transient voltages may not be obvious, identifying the root cause of equipment damage is challenging and often diagnosed as "unknown." Many integrated circuit and component failures result from voltage transients, and large equipment such as induction motors are also susceptible to costly voltage transient damage. It has been estimated that billions of dollars in electronic equipment losses occur globally each year due to voltage transients, with these numbers increasing yearly as technology evolves.

SUMMARY

Described herein are novel and innovative approaches to improving identification of issues associated with detecting anomalous conditions (e.g., electrical transient voltages) in electrical systems. The anomalous conditions may be difficult to discern, for example, because of metering constraints of Intelligent Electronic Devices (IEDs) responsible for identifying the anomalous conditions in the electrical systems. However, as is known, these anomalous conditions are often damaging to the electrical systems. The electrical systems may be associated with at least one load, process, building, facility, watercraft, aircraft, or other type of structure, for example. Additionally, the IEDs may be part of electrical/power monitoring systems responsible for monitoring and/or controlling the electrical systems, for example.

In one aspect of this disclosure, a method to automatically identify metering constraints of one or more IEDs in an electrical system includes capturing at least one energy-related waveform (e.g., voltage and/or current waveform(s)) using at least one of the IEDs in the electrical system, and processing electrical measurement data from, or derived from, the at least one energy-related waveform to identify anomalous characteristics in the electrical system. The anomalous characteristics may be indicative of an anomalous condition in the electrical system, for example. In response to identifying anomalous characteristics in the electrical measurement data, an event constraint model is built based on or using the identified anomalous characteristics. The event constraint model is analyzed to determine if the at least one energy-related waveform is being adequately captured by the at least one of the IEDs. In response to determining the at least one energy-related waveform is not adequately captured, one or more actions may be taken to address the capturing inadequacy.

As is known, anomalous characteristics/conditions may produce or lead to stresses (e.g., electrical, thermal and mechanical) that may shorten the life of equipment in an electrical system. Therefore, it is desirable to detect the anomalous characteristics/conditions and reduce the effects of the anomalous characteristics/conditions in response to detecting the anomalous characteristics/conditions (e.g., to extend the operational life of the equipment). It is important to note that a specific device may be capable of adequately/sufficiently capturing some anomalous characteristics/conditions; however, not capable of capturing other anomalous characteristics/conditions.

In some embodiments, the above method may be implemented on one or more the IEDs, for example, on the at least one of the IEDs responsible for capturing the at least one energy-related waveform. Additionally, in some embodiments the above method may be implemented partially or fully remote from the IEDs, for example, in a gateway, a cloud-based system, on-site software, a remote server, etc. (which may alternatively be referred to as a "head-end" or "Edge" system herein). Examples of the IEDs may include a smart utility meter, a power quality meter, and/or another measurement device (or devices). The at least one of the IEDs may include breakers, relays, power quality correction devices, uninterruptible power supplies (UPSs), filters, and/or variable speed drives (VSDs), for example. Additionally, the IEDs may include at least one virtual meter in some embodiments.

It is understood that the at least one energy-related waveform capture described in connection with the above method (and other methods and systems discussed below) may be associated with energy-related signals captured or measured by the at least one of the IEDs. For example, in accordance with some embodiments of this disclosure, the at least one energy-related waveform capture may be generated from at least one energy-related signal captured or measured by the at least one of the IEDs. According to IEEE Standard 1057-2017, for example, a waveform is "[a] manifestation or representation (e.g., graph, plot, oscilloscope presentation, discrete time series, equations, table of coordinates, or statistical data) or a visualization of a signal." With this definition in mind, the at least one energy-related waveform may correspond to a manifestation or representation or a visualization of the at least one energy-related signal. It is understood that the above relationship is based on one standards body's (IEEE in this case) definition of a waveform, and other relationships between a waveform and a signal are of course possible, as will be understood by one of ordinary skill in the art.

It is understood that the energy-related signal(s) captured or measured by the at least one of the IEDs discussed above may include, for example, at least one of: a voltage signal, a current signal, input/output (I/O) data, and a derived or extracted value. In some embodiments, the I/O data includes at least one of a digital signal (e.g., two discrete states) and an analog signal (e.g., continuously variable). The digital signal may include, for example, at least one of on/off status(es), open/closed status(es), high/low status(es), synchronizing pulse and any other representative bi-stable signal. Additionally, the analog signal may include, for example, at least one of temperature, pressure, volume, spatial, rate, humidity, and any other physically or user/usage representative signal.

In accordance with some embodiments of this disclosure, the derived or extracted value includes at least one of a calculated, computed, estimated, derived, developed, interpolated, extrapolated, evaluated, and otherwise determined additional energy-related value from at least one of the measured voltage signal and/or the measured current signal. In some embodiments, the derived value additionally or alternatively includes at least one of active power(s), apparent power(s), reactive power(s), energy(ies), harmonic distortion(s), power factor(s), magnitude/direction of harmonic power(s), harmonic voltage(s), harmonic current(s), interharmonic current(s), interharmonic voltage(s), magnitude/direction of interharmonic power(s), magnitude/direction of sub-harmonic power(s), individual phase current(s), phase angle(s), impedance(s), sequence component(s), total voltage harmonic distortion(s), total current harmonic distortion(s), three-phase current(s), phase voltage(s), line voltage(s), spectral analysis and/or other similar/related parameters. In some embodiments, the derived value additionally or alternatively includes at least one energy-related characteristic, the energy-related characteristic including magnitude, direction, phase angle, percentage, ratio, level, duration, associated frequency components, energy-related parameter shape, and/or decay rate. In accordance with some embodiments of this disclosure, the derived or extracted value may be linked to at least one process, load(s) identification, etc., for example.

It is understood that the energy-related signals or waveforms captured or measured by the at least one IED may include (or leverage) substantially any electrical parameter derived from at least one of the voltage and current signals (including the voltages and currents themselves), for example. It is also understood that the energy-related signals or waveforms may be continuously or semi-continuously/periodically captured/recorded and/or transmitted and/or logged by the at least one IED, and anomalous conditions may be detected based on the energy-related signals.

It is understood that an anomalous condition may refer to any type of electrical occurrence of interest. What is considered an anomalous condition for one installation, for example, may not be considered as an anomalous condition for another installation. Accordingly, a "power quality" event, for example, is an electrical occurrence of interest that is generally recognized as an anomalous condition that may adversely impact the operation of an electrical system, including the equipment installed in the electrical system. An energy-related (e.g., voltage, current) transient is one example type of power quality event (and anomalous condition). IEEE Standard 1159-2019, for example, as provided below, defines two types of transient sub-categories: impulsive and oscillatory. Impulsive transients are described as a sudden, non-power frequency changes in the voltage, current, or both that is unidirectional in polarity.' An example of an impulsive transient would be a lightning transient or electrostatic discharge. Conversely, an oscillatory transient is described as a sudden non-power frequency change in the voltage, current, or both that is bidirectional in polarity. An example cause could be capacitor bank energizing or cable switching.

| Categories | Typical spectral content | Typical duration | Typical voltage magnitude |
|---|---|---|---|
| 1.0 Transients | | | |
| 1.1 Impulsive | | | |
| 1.1.1 Nanosecond | 5 ns rise | <50 ns | |
| 1.1.2 Microsecond | 1 μs rise | 50 ns-1 ms | |
| 1.1.3 Millisecond | 0.1 ms rise | >1 ms | |
| 1.2 Oscillatory | | | |
| 1.2.1 Low frequency | <5 kHz | 0.3-50 ms | 0-4 pu[a] |
| 1.2.2 Medium frequency | 5-500 kHz | 20 μs | 0-8 pu |
| 1.2.3 High frequency | 0.5-5 MHz | 5 μs | 0-4 pu |
| 2.0 Short-duration root-mean-square (rms) variations | | | |
| 2.1 Instantaneous | | | |
| 2.1.1 Sag | | 0.5-30 cycles | 0.1-0.9 pu |
| 2.1.2 Swell | | 0.5-30 cycles | 1.1-1.8 pu |
| 2.2 Momentary | | | |
| 2.2.1 Interruption | | 0.5 cycles - 3 s | <0.1 pu |
| 2.2.2 Sag | | 30 cycles - 3 s | 0.1-0.9 pu |
| 2.2.3 Swell | | 30 cycles - 3 s | 1.1-1.4 pu |
| 2.2.4 Voltage Imbalance | | 30 cycles - 3 s | 2%-15% |
| 2.3 Temporary | | | |
| 2.3.1 Interruption | | >3 s-1 min | <0.1 pu |
| 2.3.2 Sag | | >3 s-1 min | 0.1-0.9 pu |
| 2.3.3 Swell | | >3 s-1 min | 1.1-1.2 pu |
| 2.3.4 Voltage Imbalance | | >3 s-1 min | 2%-15% |
| 3.0 Long duration rms variations | | | |
| 3.1 Interruption, sustained | | >1 min | 0.0 pu |
| 3.2 Undervoltages | | >1 min | 0.8-0.9 pu |
| 3.3 Overvoltages | | >1 min | 1.1-1.2 pu |
| 3.4 Current overload | | >1 min | |
| 4.0 Imbalance | | | |
| 4.1 Voltage | | steady state | 0.5-5% |
| 4.2 Current | | steady state | 1.0-3.0% |
| 5.0 Waveform distortion | | | |
| 5.1 DC offset | | steady state | 0-0.1% |
| 5.2 Harmonics | 0-9 kHz | steady state | 0-20% |
| 5.3 Interharmonics | 0-9 kHz | steady state | 0-2% |
| 5.4 Notching | | steady state | |
| 5.5 Noise | broadband | steady state | 0-1% |
| 6.0 Voltage fluctuations | <25 Hz | intermittent | 0.1-7% 0.2-2 $P_{st}$[b] |
| 7.0 Power frequency variations | | <10 s | ±0.10 Hz |

NOTE—
These terms and categories apply to power quality measurements and are not to be confused with similar terms defined in IEEE Std 1366 ™-2012 [B30] and other reliability-related standards, recommended practices, and guides.
[a]The quantity pu refers to per unit, which is dimensionless. The quantity 1.0 pu corresponds to 100%. The nominal condition is often considered to be 1.0 pu. In this table, the nominal peak value is used as the base for transients and the nominal rms value is used as the base for rms variations.
[b]Flicker severity index $P_{st}$ as defined in IEC 61000-4-15: 2010 [B17] and IEEE Std 1453 ™ [B31].

It is understood that the above table is one standards body's (IEEE in this case) method of defining/characterizing anomalous conditions. It is understood there are other standards that define anomalous conditions as well, such as the International Electrotechnical Commission (IEC), American National Standards Institute (ANSI), etc., which may have different definitions, descriptions or anomalous condition types, characteristics, and terminology. It is also understood that the types and descriptions of anomalous conditions may change over time, and the systems and methods disclosed herein are intended to be applicable to current and future types and descriptions of anomalous conditions. In accordance with embodiments of this disclosure, anomalous conditions may additionally or alternatively be customized anomalous conditions (e.g., defined by a user).

It is understood that several factors may be used to characterize anomalous conditions. For example, factors that may be used to characterize energy-related transients include crest (or peak) value of the transient, area of the transient, maximum rate of rise of the transient, duration on the transient, periodicity, and associated frequencies related to the transient. The effect of a transient on a specific load will depend on the level of susceptibility of components or the system to one or more of these factors; however, energy contained in the transient is usually critical in determining its impact on these components or the system. Additional aspects of transients and other anomalous conditions will be further understood from discussions below.

A system to automatically identify metering constraints of one or more IEDs in an electrical system is also provided herein. In one aspect of this disclosure, the system includes at least one processor and at least one memory device (e.g., local and/or remote memory device) coupled to the at least one processor. The at least one processor and the at least one memory device are configured to process electrical measurement data from, or derived from, at least one energy-related waveform captured using at least one of the IEDs in the electrical system in real-time, pseudo-real time, or historically (e.g., using historical data) to identify anomalous characteristics in the electrical system. Additionally, in response to identifying anomalous characteristics in the electrical measurement data, the at least one processor and the at least one memory device are configured to build an event constraint model based on or using the identified anomalous characteristics. The at least one processor and the at least one memory device are also configured to analyze the event constraint model to determine if the at least one energy-related waveform is being adequately captured by the at least one of the IEDs, and take one or more actions to address the capturing inadequacy in response to determining the at least one energy-related waveform is not adequately captured.

In some embodiments, the at least one of the IEDs capturing the energy-related waveforms includes at least one metering device. The at least one metering device may correspond, for example, to at least one metering device in the electrical system for which the energy-related waveforms are being captured/monitored.

As used herein, an IED is a computational electronic device optimized to perform a particular function or set of functions. Examples of IEDs may include smart utility meters, power quality meters, microprocessor relays, digital fault recorders, and other metering devices. IEDs may also be imbedded in VSDs, uninterruptible power supplies (UPSs), circuit breakers, relays, transformers, or any other electrical apparatus. IEDs may be used to perform measurement/monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where the IED is an electrical power monitoring device, it may be coupled to (or be installed in) an electrical power transmission or distribution system and configured to sense/measure and store data (e.g., waveform data, logged data, I/O data, etc.) as electrical parameters representing operating characteristics (e.g., voltage, current, waveform distortion, power, etc.) of the electrical distribution system. These parameters and characteristics may be analyzed by a user to evaluate potential performance, reliability and/or power quality-related issues, for example. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem/series. For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software. It is understood that hierarchies may be non-spatial such as billing hierarchies where IEDs grouped together may be physically unrelated.)

It is understood that an input is data that a processor and/or IED (e.g., the above-discussed plurality of IEDs) receives, and an output is data that a processor and/or IED sends. Inputs and outputs may either be digital or analog. The digital and analog signals may be both discrete variables (e.g., two states such as high/low, one/zero, on/off, etc. If digital this may be a value. If analog, the presence of a voltage/current may be considered by the system/IED as an equivalent signal) or continuous variables(e.g., continuously variable such as spatial position, temperature, pressure voltage, etc.). They may be digital signals (e.g., measurements in an IED coming from a sensor producing digital information/values) and/or analog signals (e.g., measurements in an IED coming from a sensor producing analog information/values). These digital and/or analog signals may include any processing step within the IED (e.g., derive a Power Factor, a magnitude, among all the derived calculations).

Processors and/or IEDs may convert/reconvert digital and analog input signals to a digital representation for internal processing. Processors and/or IEDs may also be used to convert/reconvert internally processed digital signals to digital and/or analog output signals to provide some indication, action, or other response (such as an input for another processor/IED). Typical uses of digital outputs may include opening or closing breakers or switches, starting or stopping motors and/or other equipment, and operating other devices and equipment that are able to directly interface with digital signals. Digital inputs are often used to determine the operational status/position of equipment (e.g., is a breaker open or closed, etc.) or read an input synchronous signal from a utility pulsed output. Analog outputs may be used to provide variable control of valves, motors, heaters, or other loads/processes in energy management systems. Finally, analog inputs may be used to gather variable operational data and/or in proportional control schemes.

A few more examples where digital and analog I/O data are leveraged may include (but not be limited to): turbine controls, plating equipment, fermenting equipment, chemical processing equipment, telecommunications, equipment, precision scaling equipment, elevators and moving sidewalks, compression equipment, waste water treatment equipment, sorting and handling equipment, plating equipment temperature/pressure data logging, electrical generation/transmission/distribution, robotics, alarm monitoring and control equipment, as a few examples.

As noted earlier in this disclosure, the energy-related signals captured/measured by the plurality of IEDs may include I/O data. It is understood that the I/O data may take the form of digital I/O data, analog I/O data, or a combination digital and analog I/O data. The I/O data may convey status information, for example, and many other types of information, as will be apparent to one of ordinary skill in the art from discussions above and below.

It is understood that the terms "processor" and "controller" are sometimes used interchangeably herein. For example, a processor may be used to describe a controller. Additionally, a controller may be used to describe a processor.

As will be further appreciated from discussions below, the disclosed systems and methods benefit customers by providing better data quality, reducing customer capital expenditure (CapEx), operational expenditure (OpEx), and maintenance expenditure (MaintEx) costs, accelerating problem resolutions, resolving commissioning issues, and improving the usefulness of IEDs and other types of metering/monitoring devices deployed in electrical systems. Additionally, the disclosed systems and methods benefit providers of products and solutions including the disclosed systems and methods by providing improved product value, identifying lead generation opportunities, and automating technical (e.g., power quality (PQ)) expertise.

It is understood that there are many other features and advantages associated with the disclosed invention, as will be appreciated from the discussions below.

BRIEF DESCRIPTION OF THE DRAWINGS

The foregoing features of the disclosure, as well as the disclosure itself may be more fully understood from the following detailed description of the drawings, in which:

FIG. 4A illustrates the knee of an example curve (known art);

DETAILED DESCRIPTION

Figure 1:
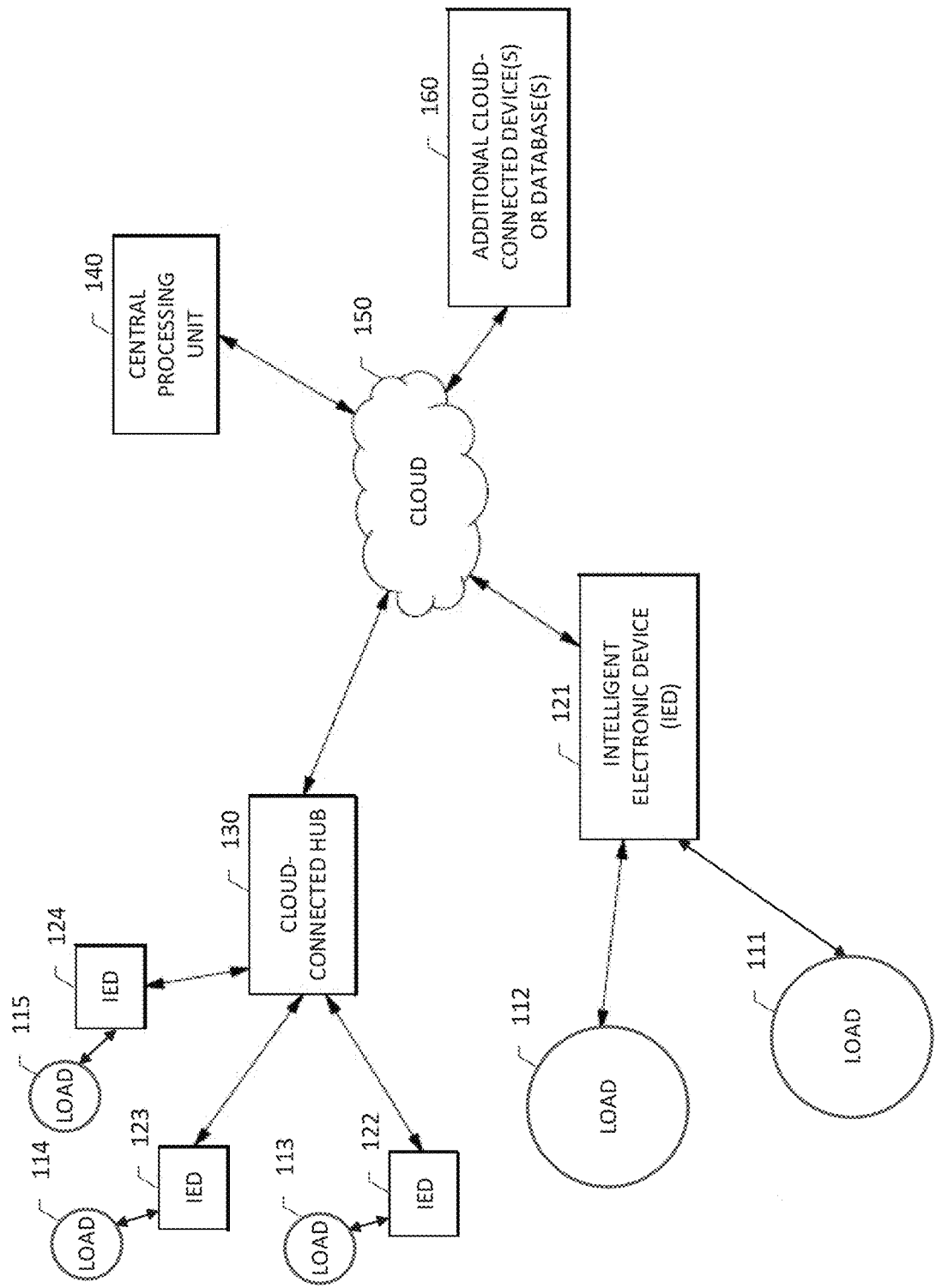
FIG. 1 shows an example electrical system in accordance with embodiments of the disclosure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

For convenience, certain introductory concepts and terms used in the specification (and adopted from IEEE Standard 1159-2019) are collected here.

As used herein, the term "aperiodic event" is used to describe an electrical event that occurs non-cyclically, arbitrarily or without specific temporal regularity. For the sake of this paper, transients are considered to be aperiodic events (i.e., notching is considered as a harmonic phenomenon).

As used herein, the term "transient" is used to describe a deviation of the voltage and/or current from the nominal value with a duration typically less than 1 cycle. Subcategories of transients include impulsive (uni-direction polarity) and oscillatory (bi-directional polarity) transients.

In embodiments, there are four general qualities that determine the impact of energy-related transient events:
1. The nature, source, and/or energy associated with the transient(s),
2. The susceptibility of the system(s), process(es) and/or load(s) to the transient(s),
3. The effect of the system(s), process(es) and/or load(s) to the transient, and
4. The cost sensitivity to this effect.

Because each facility is unique (even within homogenous market segments), it is difficult to ascertain the extent to which several (or even one) energy-related transient event(s) will impact a facility's operation. For example, it is possible for an energy-related transient event to significantly impact one facility's operation while the same energy-related transient may have little or no noticeable impact on another facility's operation. It is also possible for an energy-related transient to impact one part of a facility's electrical system differently than it does on another part of the same electrical system.

As is known, many components make up the total electrical system, both within the facility and out on the utility grid. Within the facility, components that are inductive by nature, such as transformers and motors, can generate transient voltages in electrical systems. Any disruption in the flow of current to these devices concurrently with the collapse of the device's magnetic field results in voltage impulses or transients. The effect of these transient voltages is determined by several factors, such as location on the electrical system, size of the source and its resulting transient, periodicity of events, energy associated with the event, susceptibility of adjacent equipment, and configuration of the electrical system. Several sources of transient voltages within a facility are presented in the following list:

Capacitor Switching
Current interruption (motors, etc.)
Power electronics operation (SCRs, etc.)
Electrostatic discharge
(Arc) welding
Copy machines
Faulty wiring or circuit breaker operation
Contact and relay closure
Load startup or disconnect When a transient voltage event occurs on the utility's electrical system, the magnitude of the transient event within the facility will depend on multiple criteria, such as location of the transient source, magnitude of the transient voltage, configuration of the electrical system, and mitigation devices present. While lightning is the usual suspect for transient voltages from the utility (due to the magnitude of damage generally associated with it), voltage transients due to capacitor switching are more common, especially in the summer. When a capacitor bank is energized, a large inrush current charges the capacitors, resulting in an initial notch into the voltage waveform (if the IED measuring the device is located downstream from the capacitor). The system voltage recovers quickly and overshoots its value just before switching and continues to oscillate or ring. The ringing of the system voltage is due to the addition of capacitance to a system that is inductive by nature, and typically ends within a half cycle. Some adjustable speed drive (ASD) or variable speed drive (VSD) loads are sensitive to this ringing and may trip offline as a result.

Several sources of transient voltages external to a facility are presented in the following list.

Lightning
Capacitor switching
Line/cable switching
Transformer switching
Current limiting fuse operation Although voltage transients originating on the utility's electrical system can impact a facility's operation, transient voltage sources within the facility are more common. The normal daily operation of loads within the facility—such as electric furnaces, ovens, induction heaters, welders, or motors—can produce voltage transients that affect adjacent equipment.

Referring to FIG. 1, an example electrical system in accordance with embodiments of the disclosure includes one or more loads (here, loads 111, 112, 113, 114, 115) (also sometimes referred to herein as "equipment" or "apparatuses") and one or more intelligent electronic devices (IEDs) (here, IEDs 121, 122, 123, 124) capable of sampling, sensing or monitoring one or more parameters (e.g., power monitoring parameters) associated with the loads. In embodiments, the loads 111, 112, 113, 114, 115 and IEDs 121, 122, 123, 124 may be installed in one or more buildings or other physical locations or they may be installed on one or more processes and/or loads within a building. The buildings may correspond, for example, to commercial, industrial or institutional buildings.

As shown in FIG. 1, the IEDs 121, 122, 123, 124 are each coupled to one or more of the loads 111, 112, 113, 114, 115 (which may be located "upline" or "downline" from the IEDs in some embodiments). The loads 111, 112, 113, 114, 115 may include, for example, machinery or apparatuses associated with a particular application (e.g., an industrial application), applications, and/or process(es). The machinery may include electrical or electronic equipment, for example. The machinery may also include the controls and/or ancillary equipment associated with the equipment.

In embodiments, the IEDs 121, 122, 123, 124 may monitor and, in some embodiments, analyze parameters (e.g., energy-related parameters) associated with the loads 111, 112, 113, 114, 115 to which they are coupled. The IEDs 121, 122, 123, 124 may also be embedded within the loads 111, 112, 113, 114, 115 in some embodiments. According to various aspects, one or more of the IEDs 121, 122, 123, 124 may be configured to monitor utility feeds, including surge protective devices (SPDs), trip units, active filters, lighting, IT equipment, motors, and/or transformers, which are some examples of loads 111, 112, 113, 114, 115, and the IEDs 121, 122, 123, 124, and may detect ground faults, voltage sags, voltage swells, momentary interruptions and oscillatory transients, as well as fan failure, temperature, arcing faults, phase-to-phase faults, shorted windings, blown fuses, and harmonic distortions, which are some example parameters that may be associated with the loads 111, 112, 113, 114, 115. The IEDs 121, 122, 123, 124 may also monitor devices, such as generators, including input/outputs (I/Os), protective relays, battery chargers, and sensors (for example, water, air, gas, steam, levels, accelerometers, flow rates, pressures, and so forth).

According to another aspect, the IEDs 121, 122, 123, 124 may detect overvoltage, undervoltage, or transient overvoltage conditions, as well as other parameters such as temperature, including ambient temperature. According to a further aspect, the IEDs 121, 122, 123, 124 may provide indications of monitored parameters and detected conditions that can be used to control the loads 111, 112, 113, 114, 115 and other equipment in the electrical system in which the loads 111, 112, 113, 114 and IEDs 121, 122, 123, 124 are installed. A wide variety of other monitoring and/or control functions can be performed by the IEDs 121, 122, 123, 124, and the aspects and embodiments disclosed herein are not limited to IEDs 121, 122, 123, 124 operating according to the above-mentioned examples.

It is understood that the IEDs 121, 122, 123, 124 may take various forms and may each have an associated complexity (or set of functional capabilities and/or features). For example, IED 121 may correspond to a "basic" IED, IED 122 may correspond to an "intermediate" IED, and IED 123 may correspond to an "advanced" IED. In such embodiments, intermediate IED 122 may have more functionality (e.g., energy measurement features and/or capabilities) than basic IED 121, and advanced IED 123 may have more functionality and/or features than intermediate IED 122. For example, in embodiments IED 121 (e.g., an IED with basic capabilities and/or features) may be capable of monitoring instantaneous voltage, current energy, demand, power factor, averages values, maximum values, instantaneous power, and/or long-duration rms variations, and IED 123 (e.g., an IED with advanced capabilities) may be capable of monitoring additional parameters such as voltage transients, voltage fluctuations, frequency slew rates, harmonic power flows, and discrete harmonic components, all at higher sample rates, etc. It is understood that this example is for illustrative purposes only, and likewise in some embodiments an IED with basic capabilities may be capable of monitoring one or more of the above energy measurement parameters that are indicated as being associated with an IED with advanced capabilities. It is also understood that in some embodiments the IEDs 121, 122, 123, 124 each have independent functionality.

In the example embodiment shown, the IEDs 121, 122, 123, 124 are communicatively coupled to a central processing unit 140 via the "cloud" 150. In some embodiments, the IEDs 121, 122, 123, 124 may be directly communicatively coupled to the cloud 150, as IED 121 is in the illustrated embodiment. In other embodiments, the IEDs 121, 122, 123, 124 may be indirectly communicatively coupled to the cloud 150, for example, through an intermediate device, such as a cloud-connected hub 130 (or a gateway), as IEDs 122, 123, 124 are in the illustrated embodiment. The cloud-connected hub 130 (or the gateway) may, for example, provide the IEDs 122, 123, 124 with access to the cloud 150 and the central processing unit 140. It is understood that not all IED's have a connection with (or are capable of connecting with) the cloud 150 (directly or non-directly). In embodiments is which an IED is not connected with the cloud 150, the IED may be communicating with a gateway, edge software or possibly no other devices (e.g., in embodiments in which the IED is processing data locally).

As used herein, the terms "cloud" and "cloud computing" are intended to refer to computing resources connected to the Internet or otherwise accessible to IEDs 121, 122, 123, 124 via a communication network, which may be a wired or wireless network, or a combination of both. The computing resources comprising the cloud 150 may be centralized in a single location, distributed throughout multiple locations, or a combination of both. A cloud computing system may divide computing tasks amongst multiple racks, blades, processors, cores, controllers, nodes or other computational units in accordance with a particular cloud system architecture or programming. Similarly, a cloud computing system may store instructions and computational information in a centralized memory or storage, or may distribute such information amongst multiple storage or memory components. The cloud system may store multiple copies of instructions and computational information in redundant storage units, such as a RAID array.

The central processing unit 140 may be an example of a cloud computing system, or cloud-connected computing system. In embodiments, the central processing unit 140 may be a server located within buildings in which the loads 111, 112, 113, 114, 115, and the IEDs 121, 122, 123, 124 are installed, or may be remotely-located cloud-based service. The central processing unit 140 may include computing functional components similar to those of the IEDs 121, 122, 123, 124 is some embodiments, but may generally possess greater numbers and/or more powerful versions of components involved in data processing, such as processors, memory, storage, interconnection mechanisms, etc. The central processing unit 140 can be configured to implement a variety of analysis techniques to identify patterns in received measurement data from the IEDs 121, 122, 123, 124, as discussed further below. The various analysis techniques discussed herein further involve the execution of one or more software functions, algorithms, instructions, applications, and parameters, which are stored on one or more sources of memory communicatively coupled to the central processing unit 140. In certain embodiments, the terms "function", "algorithm", "instruction", "application", or "parameter" may also refer to a hierarchy of functions, algorithms, instructions, applications, or parameters, respectively, operating in parallel and/or tandem. A hierarchy may comprise a tree-based hierarchy, such a binary tree, a tree having one or more child nodes descending from each parent node, or combinations thereof, wherein each node represents a specific function, algorithm, instruction, application, or parameter.

In embodiments, since the central processing unit 140 is connected to the cloud 150, it may access additional cloud-connected devices or databases 160 via the cloud 150. For example, the central processing unit 140 may access the Internet and receive information such as weather data, utility pricing data, or other data that may be useful in analyzing the measurement data received from the IEDs 121, 122, 123, 124. In embodiments, the cloud-connected devices or databases 160 may correspond to a device or database associated with one or more external data sources. Additionally, in embodiments, the cloud-connected devices or databases 160 may correspond to a user device from which a user may provide user input data. A user may view information about the IEDs 121, 122, 123, 124 (e.g., IED manufacturers, models, types, etc.) and data collected by the IEDs 121, 122, 123, 124 (e.g., energy usage statistics) using the user device. Additionally, in embodiments the user may configure the IEDs 121, 122, 123, 124 using the user device.

In embodiments, by leveraging the cloud-connectivity and enhanced computing resources of the central processing unit 140 relative to the IEDs 121, 122, 123, 124, sophisticated analysis can be performed on data retrieved from one or more IEDs 121, 122, 123, 124, as well as on the additional sources of data discussed above, when appropriate. This analysis can be used to dynamically control one or more parameters, processes, conditions or equipment (e.g., loads) associated with the electrical system.

In embodiments, the parameters, processes, conditions or equipment are dynamically controlled by a control system associated with the electrical system. In embodiments, the control system may correspond to or include one or more of the IEDs 121, 122, 123, 124 in the electrical system, central processing unit 140 and/or other devices within or external to the electrical system.

Figure 2:
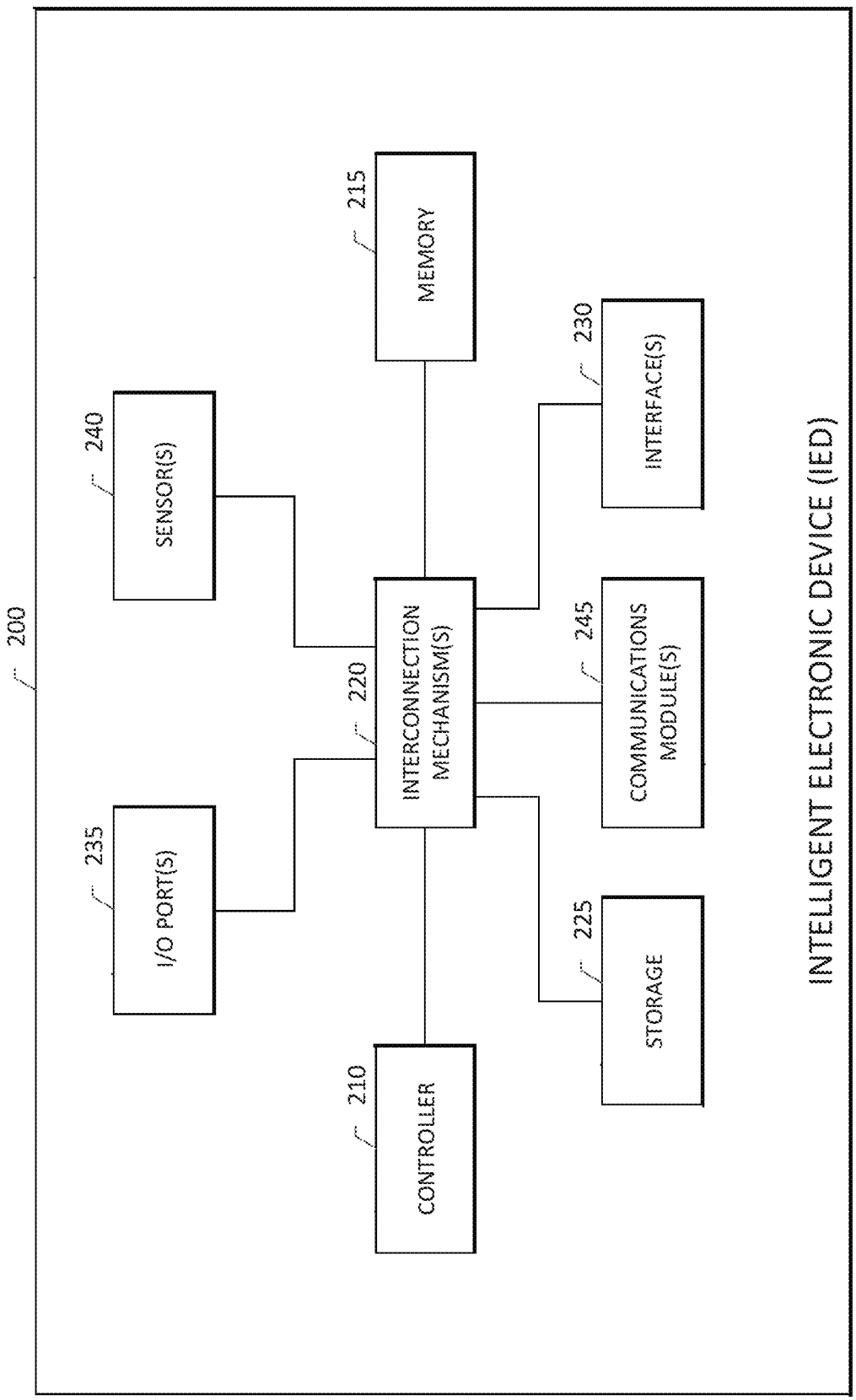
FIG. 2 shows an example intelligent electronic device (IED) that may be used in an electrical system in accordance with embodiments of the disclosure.

Referring to FIG. 2, an example IED 200 that may be suitable for use in the electrical system shown in FIG. 1, for example, includes a controller 210, a memory device 215, storage 225, and an interface 230. The IED 200 also includes an input-output (I/O) port 235, a sensor 240, a communication module 245, and an interconnection mechanism 220 for communicatively coupling two or more IED components 210-245.

The memory device 215 may include volatile memory, such as DRAM or SRAM, for example. The memory device 215 may store programs and data collected during operation of the IED 200. For example, in embodiments in which the IED 200 is configured to monitor or measure one or more electrical parameters associated with one or more loads (e.g., 111, shown in FIG. 1) in an electrical system, the memory device 215 may store the monitored electrical parameters.

The storage system 225 may include a computer readable and writeable nonvolatile recording medium, such as a disk or flash memory, in which signals are stored that define a program to be executed by the controller 210 or information to be processed by the program. The controller 210 may control transfer of data between the storage system 225 and the memory device 215 in accordance with known computing and data transfer mechanisms. In embodiments, the electrical parameters monitored or measured by the IED 200 may be stored in the storage system 225.

The I/O port 235 can be used to couple loads (e.g., 111, shown in FIG. 1) to the IED 200, and the sensor 240 can be used to monitor or measure the electrical parameters associated with the loads. The I/O port 235 can also be used to coupled external devices, such as sensor devices (e.g., temperature and/or motion sensor devices) and/or user input devices (e.g., local or remote computing devices) (not shown), to the IED 200. The external devices may be local or remote devices, for example, a gateway (or gateways). The I/O port 235 may further be coupled to one or more user input/output mechanisms, such as buttons, displays, acoustic devices, etc., to provide alerts (e.g., to display a visual alert, such as text and/or a steady or flashing light, or to provide an audio alert, such as a beep or prolonged sound) and/or to allow user interaction with the IED 200.

The communication module 245 may be configured to couple the IED 200 to one or more external communication networks or devices. These networks may be private networks within a building in which the IED 200 is installed, or public networks, such as the Internet. In embodiments, the communication module 245 may also be configured to couple the IED 200 to a cloud-connected hub (e.g., 130, shown in FIG. 1), or to a cloud-connected central processing unit (e.g., 140, shown in FIG. 1), associated with an electrical system including IED 200.

The IED controller 210 may include one or more processors that are configured to perform specified function(s) of the IED 200. The processor(s) can be a commercially available processor, such as the well-known Pentium™, Core™, or Atom™ class processors available from the Intel Corporation. Many other processors are available, including programmable logic controllers. The IED controller 210 can execute an operating system to define a computing platform on which application(s) associated with the IED 200 can run.

In embodiments, the electrical parameters monitored or measured by the IED 200 may be received at an input of the controller 210 as IED input data, and the controller 210 may process the measured electrical parameters to generate IED output data or signals at an output thereof. In embodiments, the IED output data or signals may correspond to an output of the IED 200. The IED output data or signals may be provided at I/O port(s) 235, for example. In embodiments, the IED output data or signals may be received by a cloud-connected central processing unit, for example, for further processing (e.g., to identify and track energy-related transients, as briefly discussed above), and/or by equipment (e.g., loads) to which the IED is coupled (e.g., for controlling one or more parameters associated with the equipment, as will be discussed further below). In one example, the IED 200 may include an interface 230 for displaying visualizations indicative of the IED output data or signals. The interface 230 may correspond to a graphical user interface (GUI) in embodiments.

Components of the IED 200 may be coupled together by the interconnection mechanism 220, which may include one or more busses, wiring, or other electrical connection apparatus. The interconnection mechanism 220 may enable communications (e.g., data, instructions, etc.) to be exchanged between system components of the IED 200.

It is understood that IED 200 is but one of many potential configurations of IEDs in accordance with various aspects of the disclosure. For example, IEDs in accordance with embodiments of the disclosure may include more (or fewer) components than IED 200. Additionally, in embodiments one or more components of IED 200 may be combined. For example, in embodiments memory 215 and storage 225 may be combined.

As previously discussed, most facilities are exposed to external transient voltages; additionally, many facilities use equipment that produces transient voltages. Because transient voltages have an extremely short duration, the metering limitations of many devices may not allow them to detect high-speed transients on their electrical systems. It is necessary to evaluate the voltage waveforms at a higher rate (or resolution) to identify these occurrences; however, standard available metering equipment may not be "fast enough" to capture many transient voltage events.

Another issue that can lead to the inability to capture voltage transients is improperly configuring metering devices, which may be intentional or unintentional, or usage of default device settings (which may not be optimal for capturing voltage transients in the applied system). Intentional misconfiguration is usually the result of forcing a reduction in metering device sample rates to decrease memory usage and decrease communications requirements/bandwidth. This approach is somewhat irrational because less expensive metering devices can be purchased to provide the same capabilities as the misconfigured metering device. In other words, why spend more money on a device able to capture at a higher sample rate only to constrain that very capability? Unintentional misconfiguration may be due to errors made during commissioning of the device. This may be due to a lack of knowledge regarding the metering device's potential or perhaps that a standard configuration is "always used" without consideration of the metering device's true capabilities. Another limitation may be due to intentional design constraints of the metering device such as input signal filtering (e.g., anti-alias filters). As is known, default device settings may not be optimal for capturing all types of events. Accordingly, in some instances, a metering device must be configured to optimally capture particular types of events (e.g., voltage transients) to realize the meter device's full capabilities.

Appropriate monitoring instruments make it easier to determine the sources and effects of transient voltages. A voltage transient monitoring instrument should have sufficient resolution to detect and record the transient's amplitude, duration, and time of the event. Recording the time of day is also important, because it helps a troubleshooter determine the source of the transients (internal or external to the facility). The leading edge of a voltage transient will have a polarity either into the waveform or out of the waveform. With a high-resolution transient waveform capture, the troubleshooter may be able to use the initial polarity of the transient's leading edge to narrow down the source of the transient. Given a current or neutral-to-ground voltage waveform, the troubleshooter can also confidently determine the direction of the transient source (either load-side or source-side of the meter).

To represent an analog signal (such as voltage and current), a monitoring device takes discrete snapshots of the analog signal and converts them to their approximate digital equivalent. Sample rate defines the rate/frequency measurements are taken of a signal, and is measured in samples per cycle or per unit time of the analog signal, to digitally represent the analog signal. The higher the sample rate (also sometimes referred to herein as "sampling rate", "sampling frequency", "sample frequency") of an analog signal, the more accurate the digital representation of the signal will be, assuming no outside influence(s) exists to inhibit this process (e.g., filtering, artificial limits, etc.).

The concern is that many transient events are missed or not accurately represented because some meters use fewer samples than are necessary to accurately depict the analog signal. In general, most meters will sample between 32 and 1024 samples per cycle with 128 points per cycle being typical.

While these meters may be fast enough to detect voltage sag events over multiple cycles, subcycle events such as transients may either be missed completely or not accurately represented in the digital recording. By definition (IEEE 1159-2019), transient events last less than one cycle. Because of their short duration and often unpredictable pattern of occurrence, capturing and analyzing transient events requires the use of more sophisticated monitoring devices or meters. These meters sample the analog signal at a much higher frequency than standard meters. For example, the Schneider Electric® ION9000T will sample at 10 MHz or 166,666 samples per cycle (based on a 60-Hz system) during a high-speed event, compared to the 128 samples per cycle (or less) of a typical meter. This results in data that has approximately 1,300 times better resolution than the standard available data. While longer duration events such as a voltage sags may be properly diagnosed using lower sample rates, transient events often cannot.

The systems and methods disclosed herein, as will be further appreciated from discussions below, improve identification of issues associated with detecting anomalous conditions (e.g., electrical transient voltages) in electrical systems. Anomalous conditions may be difficult to discern, for example, due to metering constraints of IEDs responsible for identifying the anomalous conditions in the electrical systems. To preface the discussion, there are several potential internal (inherent in the design of an IED) and external (i.e., outside the design of an IED) constraints associated with metering and capturing high-speed voltage/current events, for example. An IED generally has two major internal constraints for detecting a high-speed voltage/current events (there are also external constraint such a PT/CT bandwidth, etc. as well): 1) its dynamic range, and 2) its ability to sample the event fast enough to recreate the analog signal as a digital signal. The dynamic range of an IED is constraint inherent in the design of the IED and its components (i.e., its front-end, ADC, etc.). Likewise, accurately recreating an analog signal in a digital representation requires an IED capable of sampling the analog signal at a high enough speed to capture all the frequencies components associated with the signal.

An example focus of the invention disclosed herein is to analyze and identify high-speed events that include high frequency components such as voltage transients, current transients, etc., which—deliberately or otherwise—do not provide adequate/sufficient information (e.g., data, sample rate, dynamic range, etc.) related to the high-speed event. Devices adequately/sufficiently measuring/capturing the appropriate information are indicated as such. Devices that do NOT provide adequate/sufficient data/information are identified and indicated as being deficient, and recommendations or changes are made to mitigate subsequent occurrences of this issue. Mitigation may be provided through device reconfiguration or by proposing a device capable of adequately/sufficiently measuring/capturing (or better measuring/capturing) one or more events. In this case, an appropriate replacement device capable of measuring/capturing the one or more events may be suggested.

Figure 3:
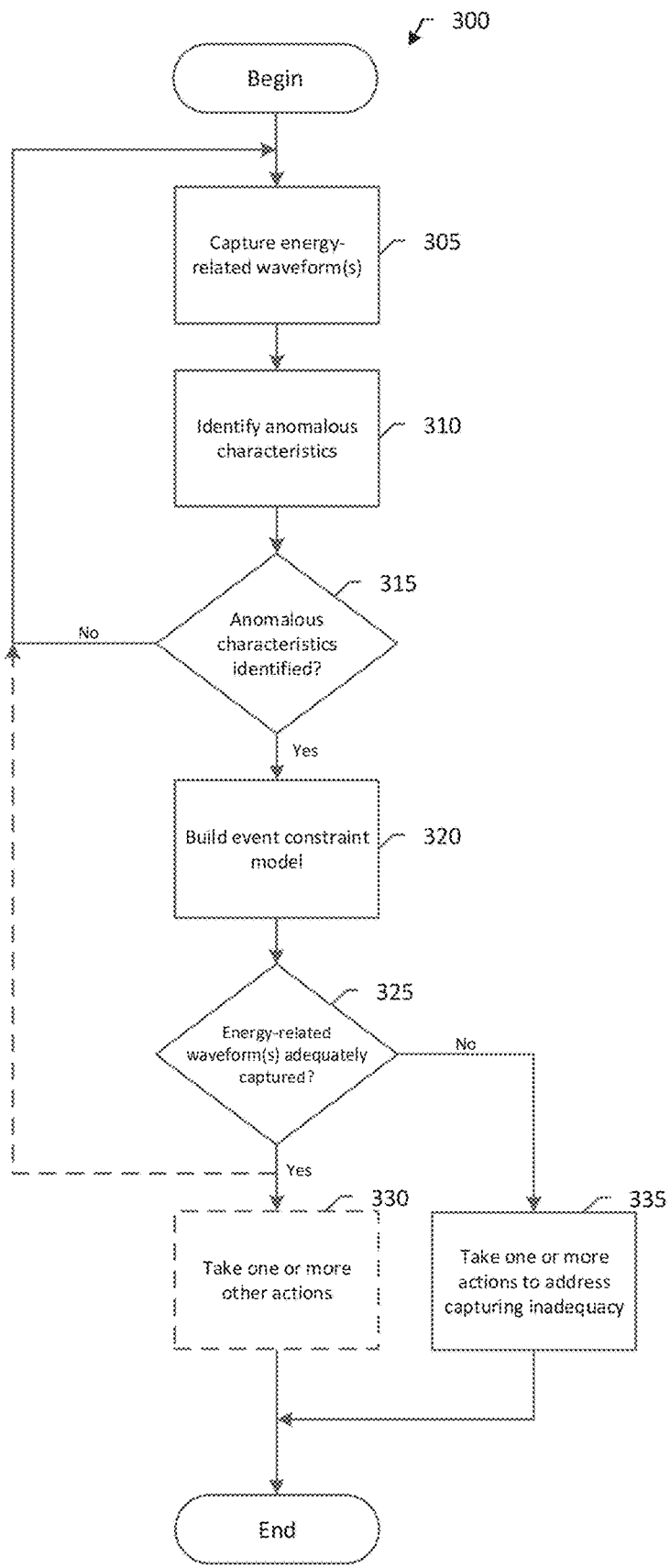
FIG. 3 is a flowchart illustrating an example implementation of a method to automatically identify metering constraints of one or more IEDs in an electrical system.
Figure 4:
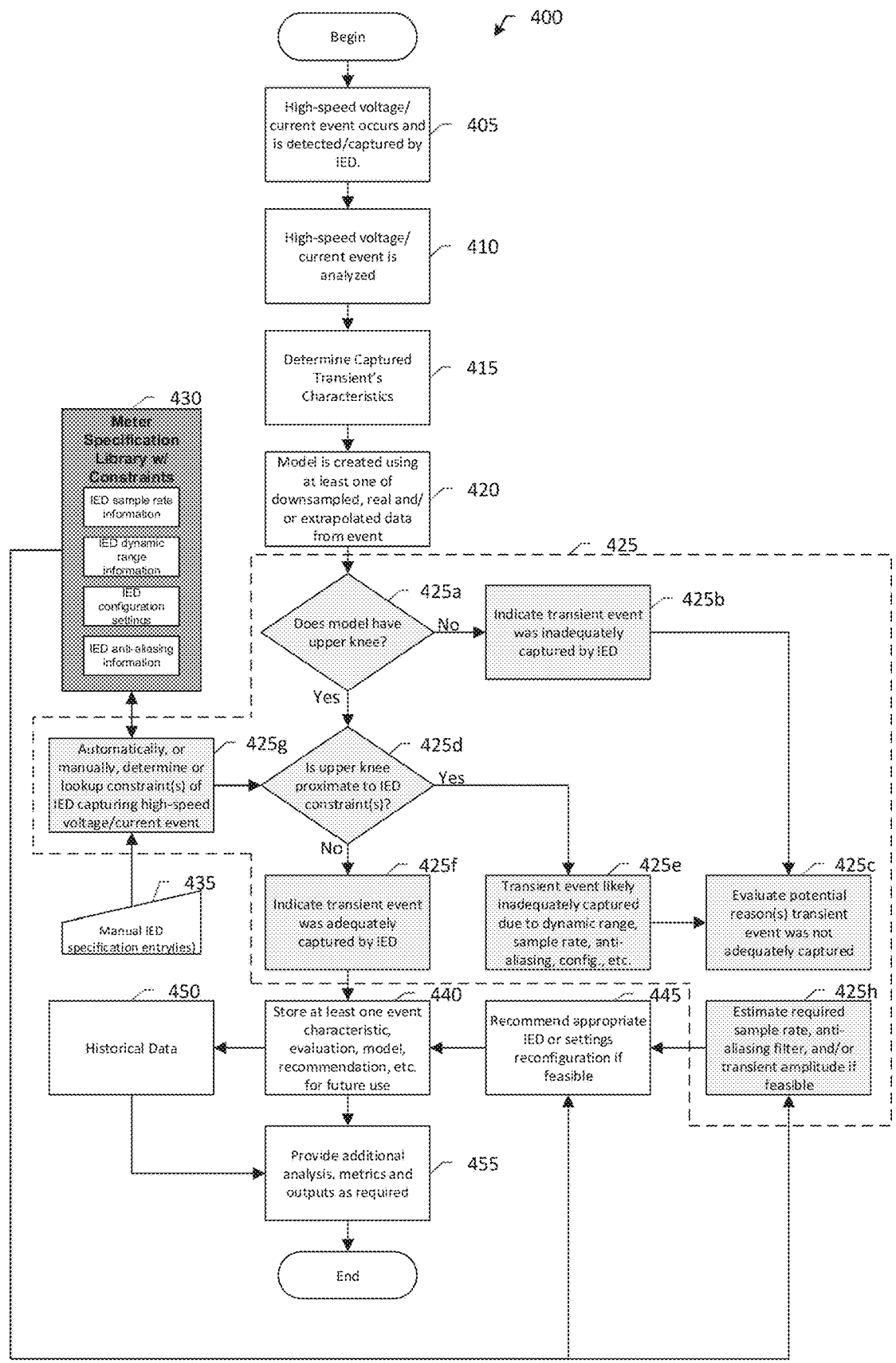
FIG. 4 is a flowchart illustrating an example implementation of a method to automatically identify metering constraints of one or more IEDs in an electrical system.
Figure 5:
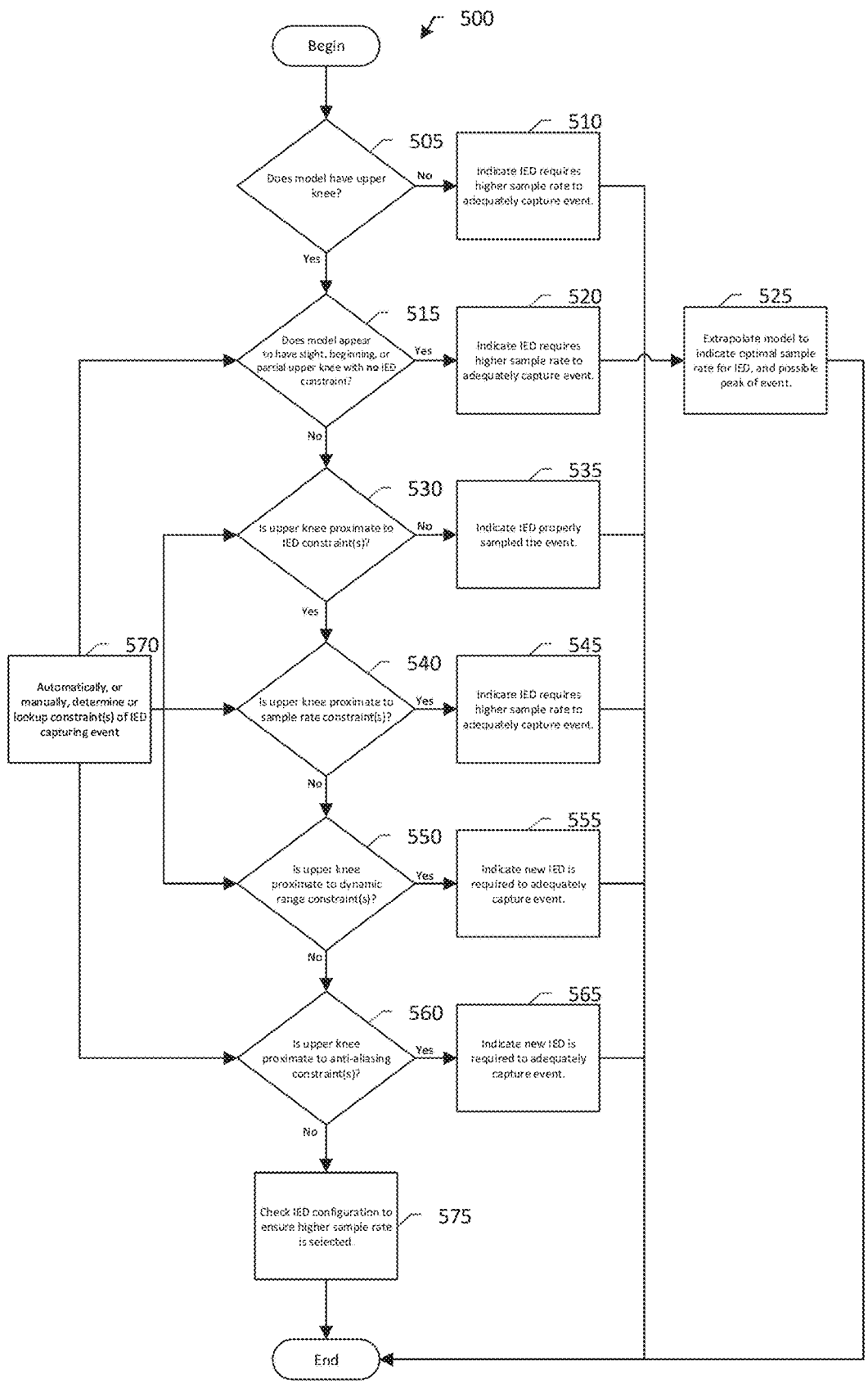
FIG. 5 is a flowchart illustrating an example implementation of a method to automatically identify metering constraints of one or more IEDs in an electrical system.

Referring to FIGS. 3, 4 and 5, several flowcharts (or flow diagrams) are shown to illustrate various methods (here, methods 300, 400, 500) of the disclosure for improving identification of issues associated with detecting anomalous conditions (e.g., electrical transient voltages) in electrical systems. Rectangular elements (typified by element 305 in FIG. 3), as may be referred to herein as "processing blocks," may represent computer software and/or IED algorithm instructions or groups of instructions. Diamond shaped elements (typified by element 315 in FIG. 3), as may be referred to herein as "decision blocks," represent computer software and/or IED algorithm instructions, or groups of instructions, which affect the execution of the computer software and/or IED algorithm instructions represented by the processing blocks. The processing blocks and decision blocks (and other blocks shown) can represent steps performed by functionally equivalent circuits such as a digital signal processor circuit or an application specific integrated circuit (ASIC).

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously (e.g., run parallel on multiple processors and/or multiple IEDs) and vice versa. Additionally, the order/flow of the blocks may be rearranged/interchanged in some cases as well. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with improving identification of issues associated with detecting anomalous conditions in electrical systems sought to be protected by this disclosure. It is also understood that various features from the flowcharts described below may be separated in some embodiments. For example, while the flowcharts illustrated in FIGS. 3, 4 and 5 are shown having many blocks, in some embodiments the illustrated method shown by these flowcharts may include fewer blocks or steps.

Referring to FIG. 3, a flowchart illustrates an example method 300 to automatically identify metering constraints of one or more IEDs in an electrical system, for example, to improve identification of issues associated with detecting anomalous conditions in electrical systems. Method 300 may be implemented, for example, on a processor of at least one IED (e.g., 121, shown in FIG. 1) of the one or more IEDs and/or remote from the one or more IEDs, for example, in at least one of: a cloud-based system, on-site/edge software, a gateway, or another head-end system.

As illustrated in FIG. 3, the method 300 begins at block 305, where energy-related waveforms (or signals) are captured, stored, etc. by at least one IED in an electrical system. The at least one IED may be installed or located, for example, at a respective metering point of a plurality of metering points in the electrical system. In some embodiments, the at least one IED may be coupled to one or more loads/equipment/apparatuses (e.g., induction motors) in the electrical system, and the energy-related waveforms captured by the at least one IED may be associated with the loads/equipment/apparatuses to which the at least one IED is coupled. The energy-related waveforms may include, for example, at least one of: voltage waveform(s), current waveform(s), power waveform(s), derivatives of voltage, current and/or power waveforms, integrals of voltage, current and/or power waveforms, and any (or substantially any) other energy-related waveform derived from the voltage and/or current signatures. The voltage and/or current waveforms may include, for example, single-phase or three-phase voltage and current waveforms.

At block 310, electrical measurement data from, or derived from, the energy-related waveforms is processed to identify anomalous characteristics (e.g., electrical disturbances) in the electrical system. The anomalous characteristics may be indicative of an anomalous condition (e.g., energy-related transient event) in the electrical system, for example. In accordance with some embodiments of this disclosure, the anomalous characteristics are identified based on one or more characteristics of the energy-related waveforms meeting at least one criteria indicative of an anomalous condition (or disturbance). For example, anomalous characteristics may be identified due to the duration (and/or other characteristic) of a detected electrical event meeting disturbance classification criteria. For example, in one embodiment the anomalous characteristics identified in the electrical system include characteristics indicative of transient voltage or current conditions in the electrical system. The characteristics indicative of the transient voltage or current conditions may include, for example, at least one of: (a) sudden, non-power frequency changes in voltage, current, or both voltage and current that is unidirectional in polarity, and (b) sudden non-power frequency change in voltage, current, or both voltage and current that is bidirectional in polarity. In accordance with some embodiments of this disclosure, the classification criteria may be established by IEEE Standard 1159-2019 or other standards or ways (e.g., user-defined classifications) in which classification criteria may be defined.

At block 315, it is determined if any anomalous characteristics were identified in the electrical measurement data at block 310. If it is determined anomalous characteristics were identified in the electrical measurement data, the method may proceed to block 320. Alternatively, if it is determined anomalous characteristics were not been identified in the electrical measurement data, the method may end or return to block 305 (e.g., for capturing more energy-related waveforms).

At block 320, an event constraint model is built based on or using the identified anomalous characteristics. Additionally, at block 325, it is determined if the at least one energy-related waveform is being adequately captured by the at least one of the IEDs based on an analysis of the event constraint model. More detailed aspects of event constrain model generation, and of determining if the at least one energy-related waveform is being adequately captured by the at least one of the IEDs based on an analysis of the event constraint model, are discussed further below in connection with FIGS. 4 and 5.

If it is determined the at least one energy-related waveform is being adequately captured by the at least one of the IEDs, the method proceed to block 330, return to block 305 (e.g., for capturing more energy-related waveforms), or end. For example, in some embodiments, subsequent to determining the at least one energy-related waveform is being adequately captured by the at least one of the IEDs, it may be desirable to take one or more actions at block 330. For example, in some embodiments it may be desirable to provide a communication indicating the at least one energy-related waveform is being adequately captured by the at least one of the IEDs. The communication may include, for example, at least one of: a report, a text, an email, appendant to an alarm, an audible communication, and a communication on an interface of a screen/display. In some embodiments, the communication may be provided to an end-user, equipment manufacturer, services team and/or other interested individual or party.

In some embodiments, it may additionally or alternatively be desirable to identify ways in which the capturing by the at least one of the IEDs may be improved or optimized at block 330. For example, in embodiments in which it is determined the at least one of the IEDs is oversampling, it may be determined improvements/optimizations may be made by decreasing the sample rate. For example, as is known, waveform captures may be resource intensive on the at least one of the IEDs, and therefore it may be desirable to reduce the sample rate of the waveform captures by the at least one of the IEDs to save resources of the at least one of the IEDs in embodiments in which the at least one of the IEDs is oversampling. As is also known, data storage may be expensive, and therefore reducing the amount of waveform capture data recorded and stored may be desirable in embodiments in which the at least one of the IEDs is oversampling. In accordance with some embodiments of this disclosure, the improvements or optimizations to the capturing may be communicated (e.g., via text, email, report, appendant to an alarm, etc.). Additionally, in accordance with some embodiments of this disclosure the improvements or optimizations to the capturing may be automatically made at block 330, for example, by the at least one of the IEDs and/or a control system coupled to the at least one of the IEDs. The control system may be communicatively coupled to the at least one of the IEDs and/or to a cloud-based system, on-site software, a gateway, and another head-end/edge system associated with the electrical system, for example.

Returning now to block 325, if it is alternatively determined the at least one energy-related waveform is not being adequately captured by the at least one of the IEDs, the method may proceed to block 335. At block 335, one or more actions may be taken to address the capturing inadequacy. For example, in one embodiment the actions taken to address the capturing inadequacy may include communicating the capturing inadequacy to an end-user, equipment manufacturer, services team and/or other interested individual or party. The communication may include, for example, at least one of: a report, a text, an email, appendant to an alarm, an audible communication, and a communication on an interface of a screen/display (e.g., a screen/display of a device associated with the end-user, equipment manufacturer, services team and/or other interested individual or party).

In accordance with some embodiments of this disclosure, the communication (e.g., report, text, etc.) indicates the capturing inadequacy and possible reasons for the capturing inadequacy. For example, it may be determined that the capturing inadequacy is due to one or more metering constraints of the at least one of the IEDs responsible for capturing the energy-related waveforms. The metering constraints may include, for example, at least one of dynamic range of the at least one of the IEDs, sample rate of the at least of the IEDs, anti-aliasing characteristics of the at least one of the IEDs, and one or more configuration parameters/constraints of the at least one of the IEDs. It is understood that other metering constraints are of course possible, as will be apparent to one of ordinary skill in the art. It is also understood that other metrics may additionally or alternatively be provided via the communication. For example, the other metrics may include present event metrics, historical event metrics, information relating to efficacy of meters (#of events not capable vs. total #of events), efficacy of meters vs. time of day (TOD), efficacy of meters improperly configured, and other potential reasons/causes for the capturing inadequacy.

In accordance with some embodiments of this disclosure, the communication additionally or alternatively provides actionable recommendations for responding to the capturing inadequacy. For example, the actionable recommendations may include at least one of: recommendations for adjusting one or more parameters associated with the at least one of the IEDs to address the capturing inadequacy, and recommendations indicating at least one IED other than the at least one of the IEDs that is capable of adequately capturing the at least one energy-related waveform. In embodiments in which the recommendations include recommendations for adjusting one or more configuration parameters associated with the at least one of the IEDs to address the capturing inadequacy, the recommendations may include recommendations for adjusting the sample rate of the at least one of the IEDs, for example. Additionally, in embodiments in which the recommendations indicate at least one IED other than the at least one of the IEDs that is capable of adequately capturing the at least one energy-related waveform, the recommendations may include a manufacturer, model, and other pertinent information about the at least one other IED. In one embodiment, the at least one other IED may have higher sample rate capability than the at least one of the IEDs capturing the at least one energy-related waveform.

In accordance with some embodiments of this disclosure, the one or more actions taken to address the capturing inadequacy may additionally or alternatively include automatically adjusting one or more parameters associated with the at least one of the IEDs to address the capturing inadequacy. For example, in embodiments in which it is determined that the capturing inadequacy is due to the sample rate of the at least one of the IEDs, the sample rate of the at least of the IEDs may be adjusted (e.g., increased) to address the sampling inadequacy. In accordance with some embodiments of this disclosure, the adjustments may be automatically made by the at least one of the IEDs and/or a control system coupled to the at least one of the IEDs (e.g., similar to the embodiment discussed above in connection with block 330). It is understood that the one or more actions taken to address the capturing inadequacy may include a number of other actions. An example of another actions is providing recommendations for optimal placement of IEDs in the electrical system, for example, to have better coverage for subsequent transients. The recommendations may be based on a variety of factors including, for example, quantity and types of metering devices currently in the electrical system, types of events a customer is most interested in detecting, budget constraints, etc. In accordance with the embodiments of this disclosure, the recommendations may be provided to the customer in the form of a report, text, email, audible form of communication and/or visually on a screen/display device.

Subsequent to block 335, the method may end in some embodiments. In other embodiments, the method may return to block 305 and repeat again (e.g., for capturing additional energy-related waveforms). In some embodiments in which the method ends after block 335, the method may be initiated again in response to user input, automatically, and/or a control signal, for example.

It is understood that method 300 may include one or more additional blocks or steps in some embodiments, as will be apparent to one of ordinary skill in the art. Other example aspects of this invention are described below in connection with method 400, for example.

Referring to FIG. 4, a flowchart illustrates another example method 400 to automatically identify metering constraints of one or more IEDs in an electrical system. In accordance with some embodiments of this disclosure, method 400 is an example implementation of method 300 discussed above in connection with FIG. 3. Similar to method 300, method 400 may be implemented, for example, on a processor of at least one IED (e.g., 121, shown in FIG. 1) and/or remote from the at least IED, for example, in at least one of: a cloud-based system, on-site software/edge, a gateway, or another head-end system.

As illustrated in FIG. 4, the method 400 begins at block 405, where a voltage/current event with high-speed characteristics (e.g., an energy-related transient, voltage sag events with high-speed characteristics) occurs and is detected/captured by at least one IED in an electrical system. For example, transient voltages, which are one example type of high-speed voltage/current event and typically last from less than a microsecond to several milliseconds, may occur and be detected/captured at block 405.

In some embodiments, the high-speed voltage/current event (e.g., transient voltages) is detected/captured from energy-related signals (or waveforms) captured/measured by the at least one IED. The at least one IED may be installed or located, for example, at a respective metering point of a plurality of metering points in the electrical system. In some embodiments, the at least one IED may be coupled to one or more loads/equipment in the electrical system, and the energy-related signals measured (and the high-speed voltage/current event detected/captured) may be associated with the loads to which the at least one IED is coupled.

As is known, voltage and/or current disturbance events (e.g., the above-discussed high-speed voltage/current event) often contain multiple high frequency components superimposed within the event. Certain types of events with shorter durations (e.g., transients) inherently are include high frequency components, and are more difficult to capture. When a high-speed voltage/current event occurs, at least one existing metering device must detect some aspect of the event to know that it occurred. In this case, the existing metering device measures/captures/saves the data associated with the event. A waveform capture is a high-speed (sample-by-sample), sequentially measured, time-series set of data points from the event's electrical signal. The event's characteristics are constrained by at least one of the metering device's sample rate, analog-to-digital converter, anti-aliasing hardware/software and/or firmware configuration.

At block 410, the high-speed voltage/current event is analyzed. For example, waveforms/signals captured by the at least one IED at block 405 may be analyzed to determine additional information associated with the high-speed voltage/current event. For example, the waveforms/signals may be analyzed to determine many characteristics including its peak amplitude, duration, initial polarity, rise time, decay rate, frequency composition, transient energy, and so forth. Additionally, the high-speed voltage/current event may be classified based on an analysis of the waveforms/signals. Transient voltages, for example, are generally classified into two different types depending on where they occur on a power system: normal mode or common mode. Normal-mode transient voltage appears between any two power or signal conductors. Common-mode transient voltage generally appears equally and in phase from each power or signal conductor to ground.

Transients may damage equipment through a number of means including dielectric breakdown, electrical flashover, fracture, thermal and instantaneous peak power overloads, and surpassing dV/dt and dI/dt limits. Dielectric (insulative) properties of equipment may be compromised when transient voltage magnitudes and rates of change cause insulators to become electrically conductive. When the dielectric is air such as the physical separation of two conductive mediums at two different voltage potentials, the dielectric breakdown of the air is generally referred to as electrical flashover. Electrical stresses associated with voltage transients may be converted into mechanical energy, resulting in fracturing of component materials. Energy from voltage transients may be converted into thermal energy, adversely altering the insulative material at a microscopic level. The rate of voltage and current changes associated with transients also plays an important role in the impact these stresses can generate in exposed materials and components.

At block 415, one or more characteristics (e.g., anomalous characteristics) associated with the high-speed voltage/current event are determined, for example, based on the additional information learned about the high-speed voltage/current event at block 410. For example, the subcategory of the voltage transient may be determined (e.g., impulsive or oscillatory). In another example, an impact/influence of the high-speed voltage/current event on equipment in the electrical system may be quantified. In some embodiments, quantifying the impact of the high-speed voltage/current event includes classifying the effects of the at high-speed voltage/current event on the equipment. For example, the effects of the high-speed voltage/current event may be classified as at least one of: an intermittent interruption, a chronic degradation, a latent failure, and a catastrophic failure.

Intermittent interruptions may occur, for example, when a transient event is injected into a data or control network, resulting in lost or corrupted data. This may result in a load or device locking up, tripping off, or operating improperly. Factors that influence a transient's ability to disturb a load include design and operating speed of semiconductors, system filters, grounding configuration, susceptibility to electromagnetic interference (EMI) and radio frequency interference (RFI), and the configuration of the data or control cable.

Chronic degradation may occur, for example, when repetitive transient events diminish the integrity of an exposed component (or components). As is known, equipment generally has an associated stress tolerance to energy-related transients. Over time, however, generally days, weeks, or even months, the cumulative effect of energy-related transients (e.g., transient voltages) may result in the eventual inoperability of the vulnerable component. Because the energy-related transients are frequent and relatively consistent in this case, locating their source is possible.

Latent failures are similar to chronic degradation, except that they are precipitated by a significant transient event that damages components, but not to the point that the component cannot perform its intended function. Over a period of time—again, days, weeks, or even months—the ordinary stresses due to normal operation will ultimately result in the component's inoperability. This type of mode is more difficult to troubleshoot because the root cause of the failure may have occurred at an indeterminate time in the past.

Catastrophic failures due to transient voltages are somewhat obvious, as the affected component will immediately cease to operate, and damage may be visible. In this case, the transient's voltage peak magnitude or rate of rise exceeds the rated threshold of the component in such a manner as to create a permanent open circuit or short circuit within the component. The odds of correlating the component failure with a power system disturbance are usually better with this type of event.

As illustrated above, in accordance with embodiments of this disclosure the impact and classification of the high-speed voltage/current event may be based on the nature and source of the high-speed voltage/current event and/or the susceptibility of the equipment to the high-speed voltage/current event. Solid-state products, microprocessor-based devices, and programmable logic controllers (PLCs) are especially susceptible to damage from voltage transients. Accordingly, exposure to voltage transients can reduce the reliability and shorten the life of this type of equipment. As technology evolves and the scale of these devices shrinks, the device components are becoming smaller. Their susceptibility to damage from voltage transients increases.

Additionally, it has been shown that transient voltages can interfere with the normal operation of equipment resulting in erratic behavior and the diminished quality of the end product. Table 3-1 in IEEE 1100-2005[1], Recommended Practice for Powering and Grounding Electronic Equipment, for example, as provided below, describes example effects of transients on equipment failure modes:

[1] IEEE Standard 1100-2005—Recommended Practice for Power and Grounding Electronic Equipment

TABLE 1

Surge Parameters Affecting Equipment Failure Modes.

| Type of Equipment | Surge Parameters ||||||
|---|---|---|---|---|---|---|
| | Source Impedance | Peak Magnitude | Maximum Rate of Rise | Tail Duration | Repetition Rate | I²t in Device* |
| Insulation | | | | | | |
| Bulk | | • | | • | | |
| Windings | | • | • | | | |
| Edges | | • | • | | | |
| Clamping SPDs | | | | | | |
| Bulk | • | • | | | • | • |
| Boundary Layer | | • | | | | |
| Crowbar SPDs | • | | | • | • | • |

TABLE 1-continued

Surge Parameters Affecting Equipment Failure Modes.

| Type of Equipment | Source Impedance | Peak Magnitude | Maximum Rate of Rise | Tail Duration | Repetition Rate | $I^2t$ in Device* |
|---|---|---|---|---|---|---|
| Semiconductors | | | | | | |
| Thyristors | | • | • | | | • |
| Triacs | • | • | • | | | • |
| IGBTs | | • | • | | | • |
| Power Conversion | | | | | | |
| DC Level | • | • | | • | • | |
| Other | | | • | • | | |
| Data Processing Malfunction | | • | • | | • | |

*The $I^2t$ in the device is the combined result of surge parameters and the device response to the surge. Like other power and energy-related equipment stress, $I^2t$ is not an independent parameter of the surge.

It is understood that interruptions in continuous manufacturing processes due to energy-related transients can result in revenue losses due to production downtime.

It is also understood that there are many different ways to characterize/classify energy-related transients in accordance with embodiments of this disclosure. Accordingly, it is understood that the above-discussed classifications (e.g., intermittent interruptions, chronic degradations, latent failures, and catastrophic failures) and classification factors are but a few of many possible ways in which the at least one energy-related transient may be characterized/classified. The table from IEEE Standard 1159-2019, for example, as provided in the summary section of this disclosure, classifies energy-related transients by type (impulsive and oscillatory) and by duration/frequency (low/medium/high), etc. However, it is understood that energy-related transients (e.g., voltage transients, current transients, etc.) may also be classified as impactful/not impactful to the load, for example, based on load changes associated with a transient event, etc.

At block 420, the characteristics of the high-speed voltage/current event determined at block 415 are evaluated to ascertain whether the IED (e.g., metering device) capturing the event did so faithfully. In particular, an event constraint model (e.g., sigmoid model) is built/created, for example, using at least one of downsampled, real and/or extrapolated data from the high-speed voltage/current event captured/detected by the at least one of the IEDs. The downsampled, real and/or extrapolated data may be associated with the characteristics associated with the high-speed voltage/current event determined at block 415, for example.

Figure 4B:
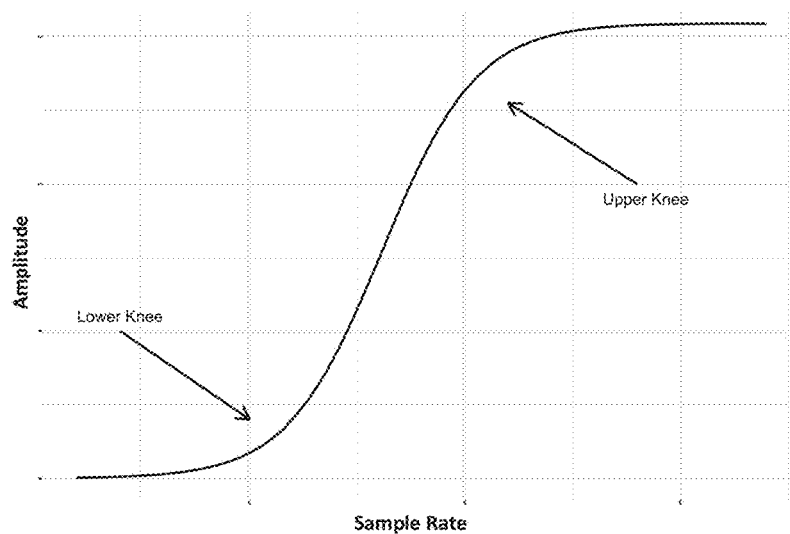
FIG. 4B illustrates three superimposed models derived from a high-speed event.
Figure 4B:
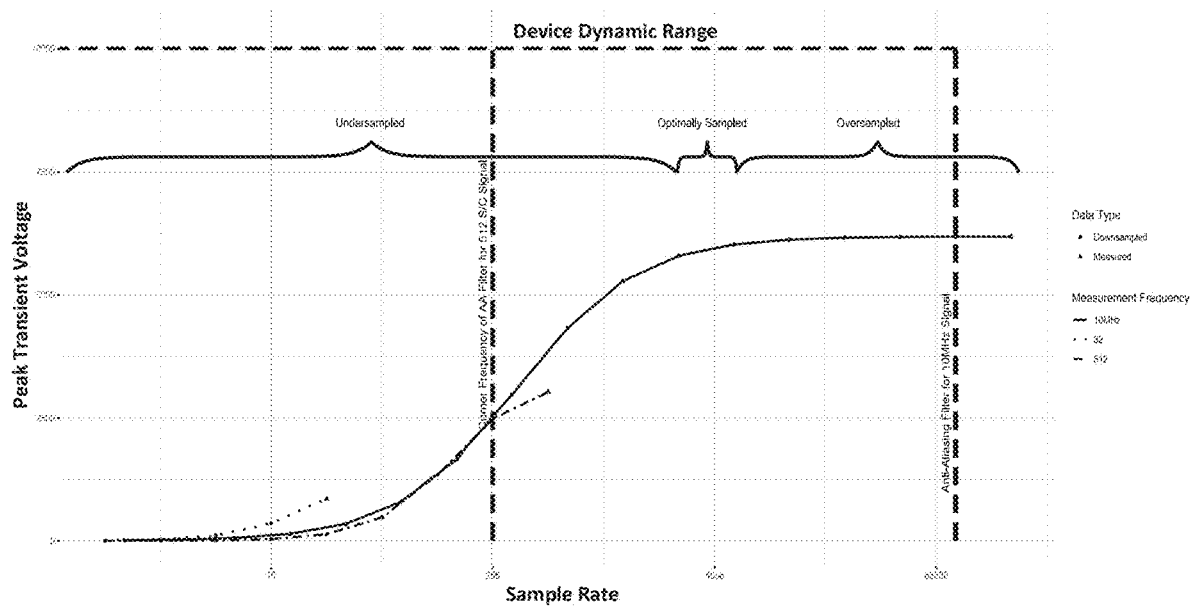

In one example implementation, the high-speed voltage/current event may be analyzed by plotting a data point on an X-Y graph, where the peak amplitude of the event is represented on the Y-axis and its respective sample rate is represented on the X-axis (see FIG. 6A, as will be discussed further below). The waveform capture data set is then reduced (e.g., downsampled, resampled, decimated) by some factor (e.g., by two) to create a new derivation of the original waveform capture. The peak amplitude of the reduced waveform capture data set is again plotted on the y-axis against its respective newly reduced sample rate as represented on the x-axis. This reduction process is repeated and graphed until an event constraint model is constructed that is in either partial sigmoid (e.g., FIGS. 6A and 6C, as will be discussed further below) or full/complete sigmoid form (e.g., FIG. 6E, as will be discussed further below). In the case of a partial sigmoid the data may also be well represented by an exponential function. Note that the partial sigmoid form/curve (which is an example event constraint model) exhibits a lower knee which resembles an exponential function, while the full sigmoid form/curve exhibits both a lower and upper knee. As is known, in mathematics, the "knee of a curve" is the point where a curve visibly bends, specifically from high slope to low slope, or in the other direction, as illustrated in FIG. 4A (known art). In accordance with embodiments of this disclosure, the above-discussed upper and lower knees are a very important indicator when analyzing the ability of a metering device to adequately/sufficiently detect and capture high-speed voltage/current events, as will be further appreciated from discussions below. Three example event constraint models representative of possible event constraint model(s) built at block 420 are shown in FIG. 4B, for example. FIG. 4B will be discussed in detail later on in this disclosure.

At block 425, the event constraint model built at block 420 is analyzed to determine if the at least one energy-related waveform is being adequately captured by the at least one of the IEDs (e.g., at block 405). For example, it may initially be determined if the model built at block 420 has an upper knee or at least a partial upper knee (e.g., one or two data points to the right of the inflection point of the knee) at block 425a.

If it determined the model does not have an upper knee, it may be determined that the transient event was inadequately captured/sampled by the at least one of the IEDs. In accordance with some embodiments of this disclosure, an indication or communication may be provided indicating the transient event was inadequately captured by the at least one of the IEDs at block 425b. Similar to the embodiments discussed above in connection with FIG. 3, the indication or communication may take the form of at least one of: a report, a text, an email, appendant to an alarm, an audible communication, and a communication on an interface of a screen/display, for example. In addition to the indication or communication, potential reasons the transient event was not adequately captured may be further evaluated at block 425c. Additionally, the IED (e.g., meter) type and configuration of the at least one of the IEDs may be analyzed to determine if it is possible to increase the sample rate (or other IED/meter constraints) associated with the at least one of the IEDs. If not possible to increase the sample rate (or other IED/meter constraints), an indication or communication may be provided indicating a higher sample rate IED (or IED with other constraints) should be used. In a system analysis, it may also be recommended to interchange/swap or replace one or more of the at least one of the IEDs with another IED (e.g., a more capable IED) in the system which is in an area with redundant coverage of transients (e.g., two or more IED's are capturing at an adequate rate already).

Returning now to the first step of block 425 (i.e., block 425*a*), if it is alternatively determined the model has an upper knee (or at least a partial upper knee), the method may proceed to determine whether the upper knee is proximate to IED constraint(s) or if the sigmoid model has a constraint proximate to the upper-right knee at block 425*d*. In accordance with some embodiments of this disclosure, this determination is made based on a comparison of one or more characteristics/traits of the upper knee to one or more constraints of the IED. In accordance with some embodiments of this disclosure, the constraints are automatically or semi-automatically looked-up or manually provided (as indicated by block 425*g*), or some combination or the two, for example, from a meter specification library with constraints (as indicated by block 430) and/or a user (e.g., as indicated by block 435). As shown in block 430, the constraints may include at least one of: IED sample rate information, IED dynamic range information, IED configuration settings, and IED anti-aliasing information, for example. Additionally, as shown in block 435, the user provided constraints may include one or more manually entered IED specification entries, for example, which may be the same as or similar to the constraints discussed in connection with block 430 in some instances.

If it is determined that the upper knee is proximate to the IED constraint(s) at block 425*d*, it may be further determined that the transient event likely was inadequately captured due to the IED constraint(s) (e.g., dynamic range, sample rate, anti-aliasing, configuration settings, and/or other constraints) of the at least one of the IEDs at block 425*e*. Additionally, potential reasons the transient event was not adequately captured may be further evaluated at block 425*c*. For example, the potential reasons may be evaluated by determining which constrain(s) is proximate to the upper-right knee. If the knee is proximate to the dynamic range of the at least one of the IEDs, for example, it may be determined that the capturing inadequacy may be addressed by using an IED with a greater dynamic range. Additionally, if the knee is proximate to the sample rate, it may be determined that the capturing inadequacy may be addressed by an IED with a higher sample rate and Nyquist/folding frequency. Further, if the knee is proximate to the anti-aliasing filter, it may be determined that the capturing inadequacy may be addressed by an IED with a higher sampling range, which may inherently require an increased sample rate, Nyquist/folding frequency, and/or corner frequency at a higher frequency.

If it is determined that the upper knee is not proximate to the IED constraint(s), an indication or communication may be provided indicating the transient event was adequately captured by the at least one of the IEDs at block 425*f*. Similar to the embodiments discussed above, the indication or communication may take the form of at least one of: a report, a text, an email, appendant to an alarm, an audible communication, and a communication on an interface of a screen/display, for example. Additionally, in response to determining the transient event was adequately captured by the at least one of the IEDs, at least one characteristic, evaluation, model, recommendation, etc. associated with the analysis performed in the method may be saved (e.g., on a memory device associated with the at least one of the IEDs) for future use at block 440. For example, the at least one characteristic, evaluation, model, recommendation, etc. may be saved and used as historical data, as indicated by block 450. In general, information related to the event, its associated waveform capture, any assessment or evaluation, model, characteristic, and/or recommendation may be stored for future use. Data storage of the aforementioned information may be located in the cloud, edge, gateway, IED, and/or other repository that may or may not be accessed at a future time.

In accordance with some embodiments of this disclosure, additional analysis, metrics and outputs may be further provided at block 455 for one or multiple locations, for example, based on analysis of the at least one characteristic, evaluation, model, recommendation stored at block 440 (e.g., current data or latest historical data) with respect to previous historical data. Example analysis, metrics and outputs that may be further provided at block 455 include, for example, present event metrics, historical event metrics, efficacy of meters (e.g., #of events not capable vs. total #of events), efficacy vs. time of day (TOD), efficacy of meters not properly configured, and/or potential causes. With respect to efficacy vs. TOD, it is understood that this is an analysis to determine whether different types of energy-related events occur at different times of the day. This may indicate different transient sources for respective times of day, for example.

At a system level, an indication of how meter captures (or lack thereof) relate may also be provided at block 455. It is understood that many other types of information may additionally or alternatively be provided at block 455, as will be apparent to one of ordinary skill in the art. For example, analyses may include ascertaining statistical confidences, statistical significance, feature extraction, improved configurations/settings, time-series analysis, site aggregation, system level analysis, global benchmarking, more capable IED recommendations, suggested sample rates, potential impacts and so forth. Additionally, metrics may include device and/or system baselines, transient location statistics, impactful transients adequately captured vs. inadequately captured, and so forth.

As illustrated in FIG. 4, in accordance with some embodiments of this disclosure, the meter specification library with constraints, as indicated by block 430, may be used to estimate required sample rate, anti-aliasing filter, and/or transient amplitude if feasible (e.g., at block 425*h*), and/or recommend appropriate IED or settings reconfiguration if feasible, and this information may be stored (e.g., at block 440) and to provide additional analysis, metrics and outputs as required (e.g., at block 455).

In accordance with some embodiments of this disclosure, the IED sample rate and/or other metering constraints may be automatically adjusted or configured to address inadequacies identified at one or more blocks of method 400 and other methods disclosed herein. For example, if an IED sample rate inadequacy is identified, the IED sample rate may be automatically increased or optionally decreased to address the identified inadequacy. It is understood that the amount by which the sample rate is increased, decreased or otherwise changed or set may be based on one or more factors. For example, the sample rate may be set/selected based, at least in part, on device capabilities/limitations, customer preference(s), application(s) in which the IED(s) is/are being used, etc. For example, as is known, there is generally a tradeoff between sampled rate of a waveform capture, the length of the waveform capture, and the memory available to store data sampled by IEDs (and/or other devices). In accordance with some embodiments of this disclosure, the sample rate may be set/selected based, at least in part, on this tradeoff. For example, in instances where there are memory constraints/limitations, the sample rate may be set at a lower value than in instances where there is more memory available (i.e., less memory constraints/limitations associated with IED and/or other device). Additionally, the sample rate may be decreased or increased depending on the application. For example, in embodiments in which the invention is used in motor diagnostics applications, it may be more necessary to decrease the sample rate (within reason) of waveforms than in other applications if there are memory constraints. More particularly, motor diagnostics applications may require the waveform to be recorded over a longer period (and, thus, improve the frequency resolution of the signal for analysis/identification of long term conditions, for example) than in other applications, and this may require reducing the sample rate of the waveform to ensure both 1) the data is useful, and 2) the IED is capable of recording the appropriate frequency resolution within the constraints/limitations of the IED's memory.

In accordance with some embodiments of this disclosure, an optimal sample rate may also be determined or learned using this method. For example, an initial sample rate may be selected, and the initial sample rate may be optimized/refined over time based on an evaluation of capturing performance, device or system constraints (which may change over time), etc. In one example implementation, the initial sample rate may be a relatively high sample rate (e.g., a max sample rate of an IED), and data (e.g., waveform data, logged data) from the IED and/or system and/or other device may be analyzed over time to determine the optimal sample rate (e.g., based on analysis of historical data). The sample rate may be dynamically adjusted in response to the analysis, for example. In one example implementation, the sample rate may be dynamically adjusted based on what information is needed (or what a customer is interested in) at a particular point in time (i.e., the invention provides for an on-demand sample rate adjustment). In another example implementation, the waveforms may be captured using an IED's maximum sample rate; then downsampled/resampled to an optimal sample rate that is correct for the characteristic data in the waveform or for a specific application, so that memory is conserved and/or communications bandwidth requirements are minimized. It is understood that reducing the sample rate may hinder the IED and/or system and/or other device from detecting the true peak (and other characteristics) of a transient event in a waveform capture. In other words, the lower the sample rate, the greater the chance the IED and/or system and/or other device may not detect the true peak. However, depending on the customer application(s) and/or need(s), for example, it may not be necessary to detect the true peak (or the customer may not care whether the true peak is missed). For example, in embodiments in which a transformer is present, the transformer may filter high frequency components associated with transients. This may not be relevant if the customer is more interested in longer waveform captures than detecting the true peak of transient events.

Returning now to method 400, subsequent to block 455, the method may end in some embodiments. In other embodiments, the method may return to block 405 and repeat again (e.g., to capture additional high-speed voltage/current events). In some embodiments in which the method ends after block 455, the method may be initiated again in response to user input and/or a control signal, for example. The user may also manually provide energy-related waveforms into the process to analyze, as previously mentioned.

It is understood that many additional and alternative configurations of method 400 illustrated in FIG. 4 are, of course, possible. For example, as note above the description of method 400, the order of analyses in the various methods disclosed herein may be changed or some aspects or blocks may be omitted. Additional aspects of identifying metering constraints, and other aspects of this invention, are discussed further in connection with FIG. 5 below, for example.

Referring to FIG. 5, a flowchart illustrates another example method 500 to automatically identify metering constraints of one or more IEDs in an electrical system. In accordance with some embodiments of this disclosure, method 500 is an example implementation of portions of method 300 and/or method 400 discussed above in connections with FIGS. 3 and 4. It is understood that the processes illustrated by methods 300, 400 and 500 may have redundant pieces. Additionally, in some embodiments a combination of these three processes may be used, some subset of these three processes may be used, and/or aspects may be omitted, etc. Similar to methods 300 and 400, method 500 may be implemented, for example, on a processor of at least one IED (e.g., 121, shown in FIG. 1) and/or remote from the at least IED, for example, in at least one of: a cloud-based system, on-site software/edge, a gateway, or another head-end system.

As illustrated in FIG. 5, the method begins at block 505 where an event constraint model built/created, for example, at block 420 of method 400, is analyzed to determine if energy-related waveform(s) captured by at least one IED an electrical system are being adequately captured. In particular, at block 505 it is determined if the event constraint model has a partial upper knee or if the model exhibits a complete upper knee. As discussed above in connection with FIG. 4, in mathematics, the "knee of a curve" is the point where a curve visibly bends, specifically from high slope to low slope, or in the other direction.

If it is determined the event constraint model does not have has a partial upper knee or a complete upper knee, the method may proceed to block 510 where an indication or communication is provided indicating the at least one IED requires a higher sample rate to adequately capture an energy-related event in the electrical system. Similar to the embodiments discussed above in connection with previous figures, the indication or communication may take the form of at least one of: a report, a text, an email, appendant to an alarm, an audible communication, and a communication on an interface of a screen/display, for example.

At block 505, if it is alternatively determined the event constraint model has an upper knee, the method may proceed to block 515. At block 515, it is determined if the model appears to have a slight, beginning or partial of an upper knee (i.e., has a partial upper knee). In accordance with some embodiments of this disclosure, the upper knee may be automatically, semi-automatically or manually looked up, for example, from a meter specification library with constraints (e.g., 430, shown in FIG. 4), as indicated by block 570. If it is determined if the model appears to have a slight, beginning or partial of an upper knee, the method proceeds to block 520 where an indication or communication (e.g., text, email, report, appendant to an alarm, etc.) is provided indicating the IED requires a higher sample rate to adequately capture the event(s). Additionally, subsequent to block 520, the method may proceed to block 525 where the model is extrapolated to indicate optimal sample rate(s) for the IED, and possible peak of event(s).

At block 515, if it is alternatively determined the model does not appear to have a slight, beginning or partial of an upper knee, but rather has a full upper or complete knee, the method proceeds to block 530. If it is determined the model has a full or complete upper knee, the method proceeds to block 535 where an indication or communication (e.g., text, email, report, appendant to alarm data, etc.) is provided indicating the IED properly sampled the event. It may be possible to perform some extrapolation of the model to determine more precisely the level of sampling with respect to optimal or oversampling. It may also be possible to better project or better improve the accuracy of the waveform event's peak amplitude.

At block 530, if it is alternatively determined the upper knee is near IED constraint(s) (e.g., occurs near an anti-aliasing filter, IED Nyquist frequency, IED dynamic range, etc.), an indication or communication (e.g., text, email, report, appendant to an alarm, etc.) may be provided indicating the waveform capture does not appear to have been properly captured by the IED. Additional evaluations may be subsequently performed to identify the source of improperly/inadequately capturing the event's waveform. For example, the method may proceed to block 540 where it is determined if the upper knee result is proximate to sample rate constraint(s). If it is determined the upper knee result is proximate to sample rate constraint(s), the method proceed to block 545 where an indication or communication (e.g., text, email, report, appendant to an alarm or alarm data, etc.) is provided indicating the IED requires a higher sample rate to adequately capture the event.

At block 540, if it is alternatively determined the upper knee result is not proximate to sample rate constraint(s), the method proceeds to block 550 where it is determined if the upper knee results proximate to dynamic range (e.g., an IED's peak measurement capability) constraints. If it is determined the upper knee result is proximate to dynamic range constraints, then indicate a higher sample rate may be required to adequately capture the event. The user may be informed the existing IED can never be capable of adequately capturing the waveform event. For example, an indication or communication (e.g., text, email, report, appendant to an alarm, etc.) may be provided at block 555 indicating a new IED is required to adequately capture the event. In accordance with some embodiments of this disclosure, recommended specifications associated with the new IED and/or manufacturer, model, etc. associated with possible new IED's may be provided.

At block 550, if it is alternatively determined the upper knee result is not proximate to dynamic range constraints, the method proceeds to block 560 where it is determined whether the upper knee result is proximate to anti-aliasing (i.e., filtering frequency) constraint(s). If it is determined the upper knee result is proximate to anti-aliasing constraint(s), the method proceeds to block 565 where an indication or communication (e.g., text, email, report, appendant to an alarm, etc.) may be provided indicating the anti-aliasing filter should be adjusted (if possible) or an IED with a greater bandwidth (i.e., higher frequency measurement capabilities) should be employed to adequately capture the event. Similar to the embodiment discussed above in connection with block 550, in accordance with some embodiments of this disclosure, recommended specifications associated with the new IED and/or manufacturer, model, etc. associated with possible new IED's may be provided.

At block 560, if it is alternatively determined the upper knee result is not proximate to anti-aliasing constraints, the method proceeds to block 575 where the IED configuration is checked to ensure a higher sample rate is selected. In accordance with some embodiments of this disclosure, the higher sample rate may be automatically selected (e.g., using derived data from waveforms, machine-learning techniques, etc.). Additionally, in accordance with some embodiments of this disclosure, the higher sample rate may be manually or semi-automatically selected, for example, in response to user input.

It is understood that in all of the above-discussed cases, data from an IED Specification Library outlining constraints may be used to assist with recommendations, as indicated by block 570, as briefly discussed above. For example, a specific IED's capable sample rate, signal filtering, dynamic range, and so forth may be used to provide contextual information in the waveform's assessment. The data in IED Specification Library data may be automatically determined (i.e., based on derived Nyquist frequency) or the IED's configuration. The IED Specification Library's day may also be manually entered by the end-user as needed/required. Data entered into the IED Specification Library file may be entered at one site/location/customer and used at all other sites/locations/customers (i.e., the IED Specification Library may be shared between sites/locations/customers if desired). It is understood that some or all aspects/data in the IED Specification Library may be determined/defined prior to deploying at an end-user's facility.

Subsequent to block 575, the method may end in some embodiments. In other embodiments, the method may return to block 505 and repeat again (e.g., to re-evaluate the model). In some embodiments in which the method ends after block 575, the method may be initiated again in response to user input and/or a control signal, for example.

An example to further illustrate the invention is provided below.

A high-speed transient event of approximately 5,000 volts was generated and simultaneously captured on one phase of three discrete IEDs (Device 'A', Device 'B', and Device 'C'). Device A captured the transient event at a sample rate of 32 samples/cycle (i.e., 32 S/C or 1.92 kHz on a 60 Hz system), Device B captured the transient event at a sample rate of 512 samples/cycle (i.e., 512 S/C or 30.72 kHz on a 60 Hz system), and Device C captured the transient event at a sample rate of 166,667 samples/cycle (i.e., 166,667 S/C or 10 MHz on a 60 Hz system). The waveform capture from all three IEDs is shown in FIGS. 6, 6B and 6D, respectively.

Figure 6:
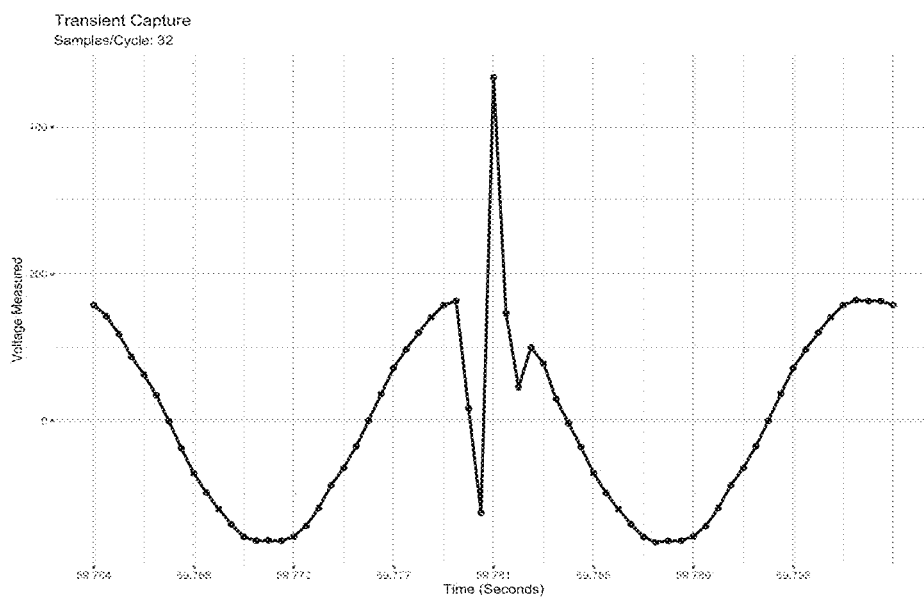
FIG. 6 illustrates an example transient event capture sampled at 32 samples/cycle.

FIG. 6 from Device A shows the initial polarity of the transient event was into the waveform, and the event exhibits a maximum voltage deviation of 468 volts at a phase angle of approximately 90°. FIG. 6B from Device B shows the initial polarity of the same transient event was out of the waveform, and the entire event exhibits a maximum voltage deviation of 2,828 volts at a phase angle of approximately 90°. FIG. 6D from Device C show the initial polarity of the same transient event was out of the waveform, and the entire event exhibited a maximum voltage deviation of 5,020 volts at a phase angle of approximately 90°.

As can be seen, the peak amplitudes and precise phase angle of occurrence are different on all three waveform captures. This is a direct result of the different sample rates used to capture the same transient event. In brief, the slower sample rates are not capturing important data that occurred during their respective intersample intervals related to the transient event. It is similar to a camera taking a picture at a low resolution versus a high-resolution; information/data is lost.

Figure 6A:
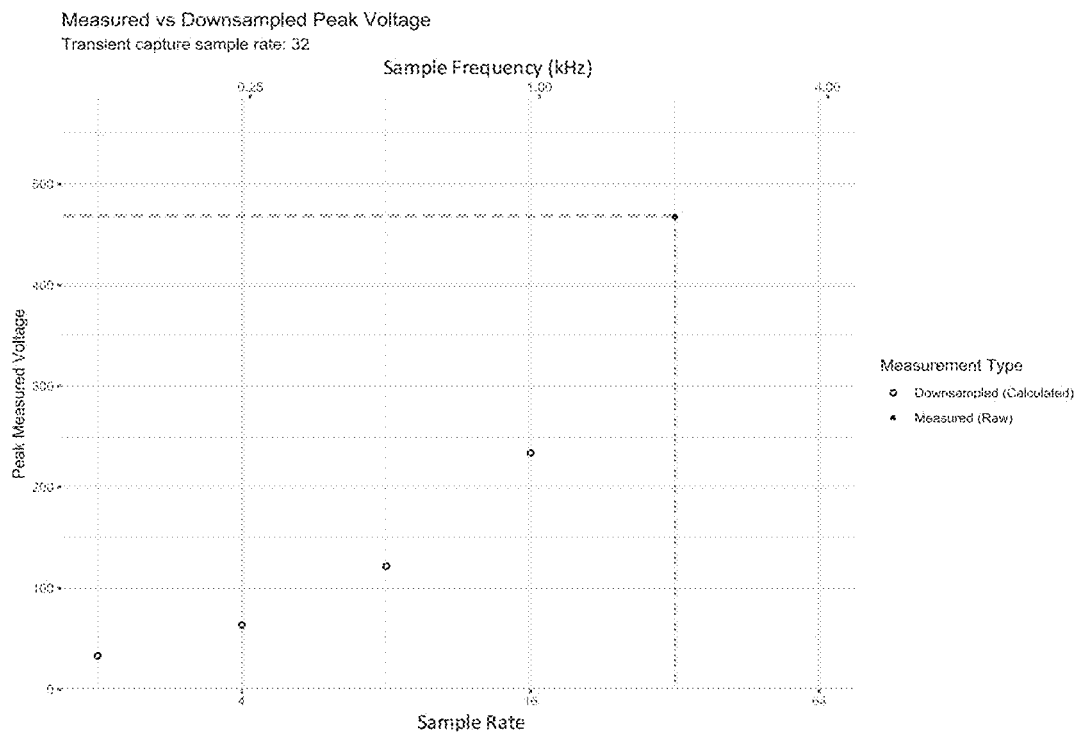
FIG. 6A illustrates an example downsampling model for the example transient event capture shown in FIG. 6.
Figure 6B:
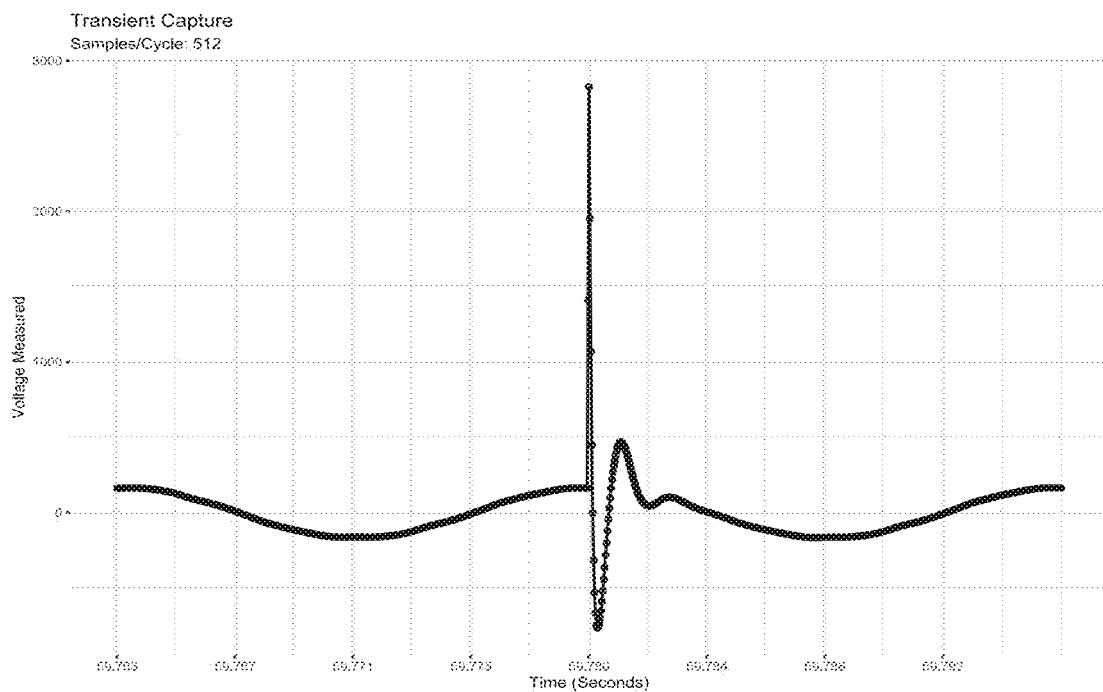
FIG. 6B illustrates another example transient event capture sampled at 512 samples/cycle.
Figure 6C:
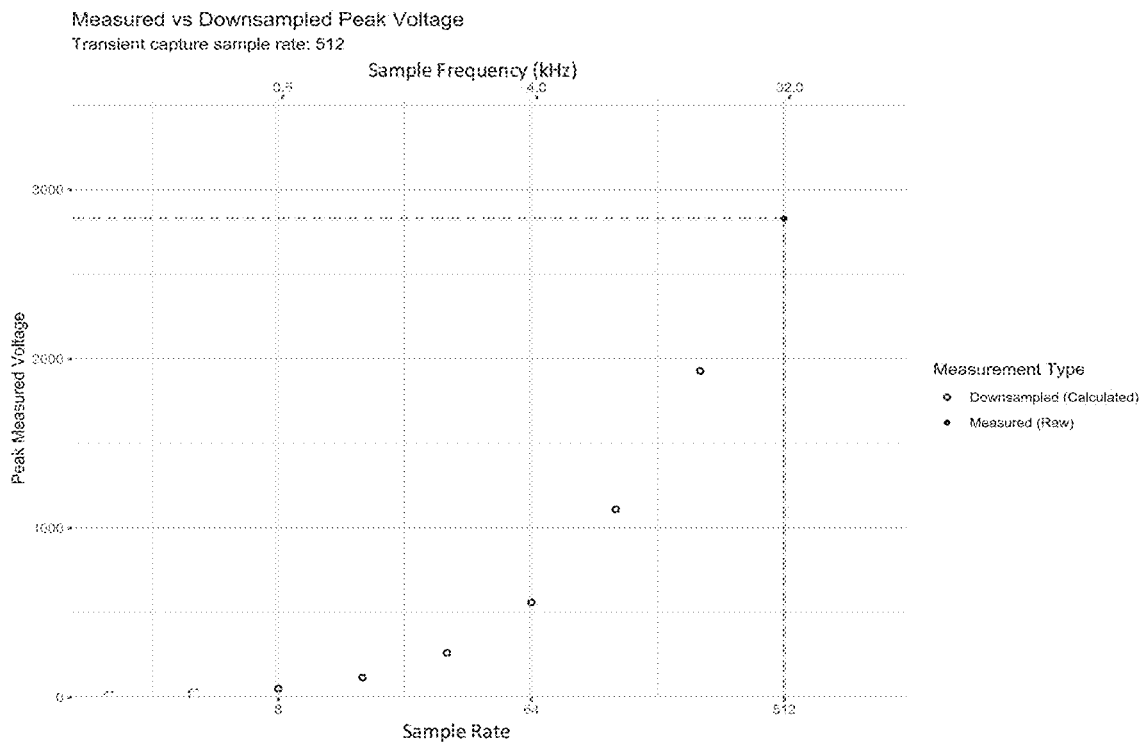
FIG. 6C illustrates an example downsampling model for the example transient event capture shown in FIG. 6B.
Figure 6D:
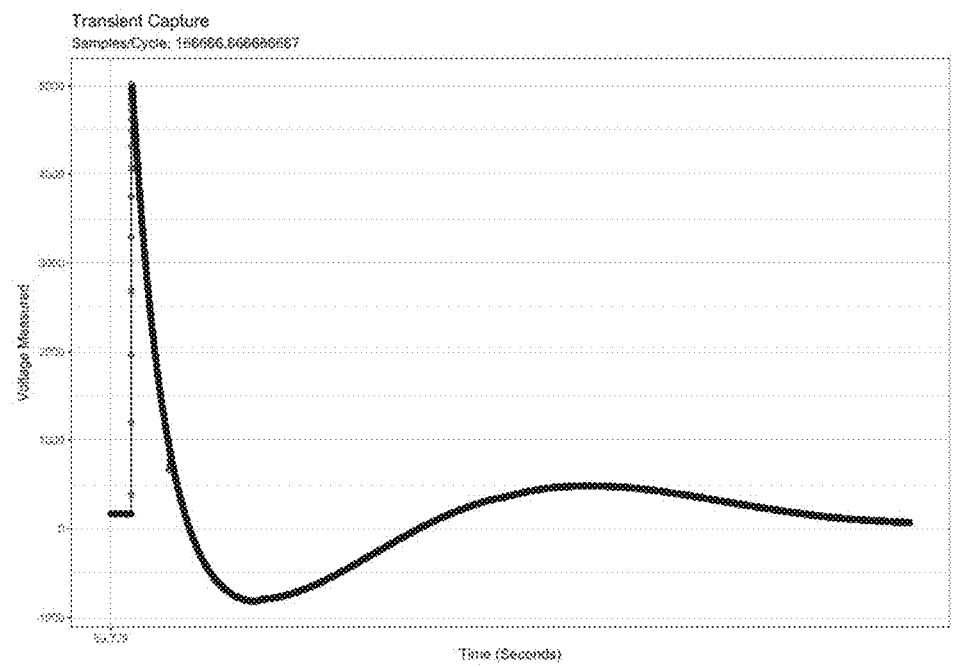
FIG. 6D illustrates a further example transient event capture sampled at 166,666 samples/cycle (i.e., 10 Mhz on 60 Hz system)
Figure 6E:
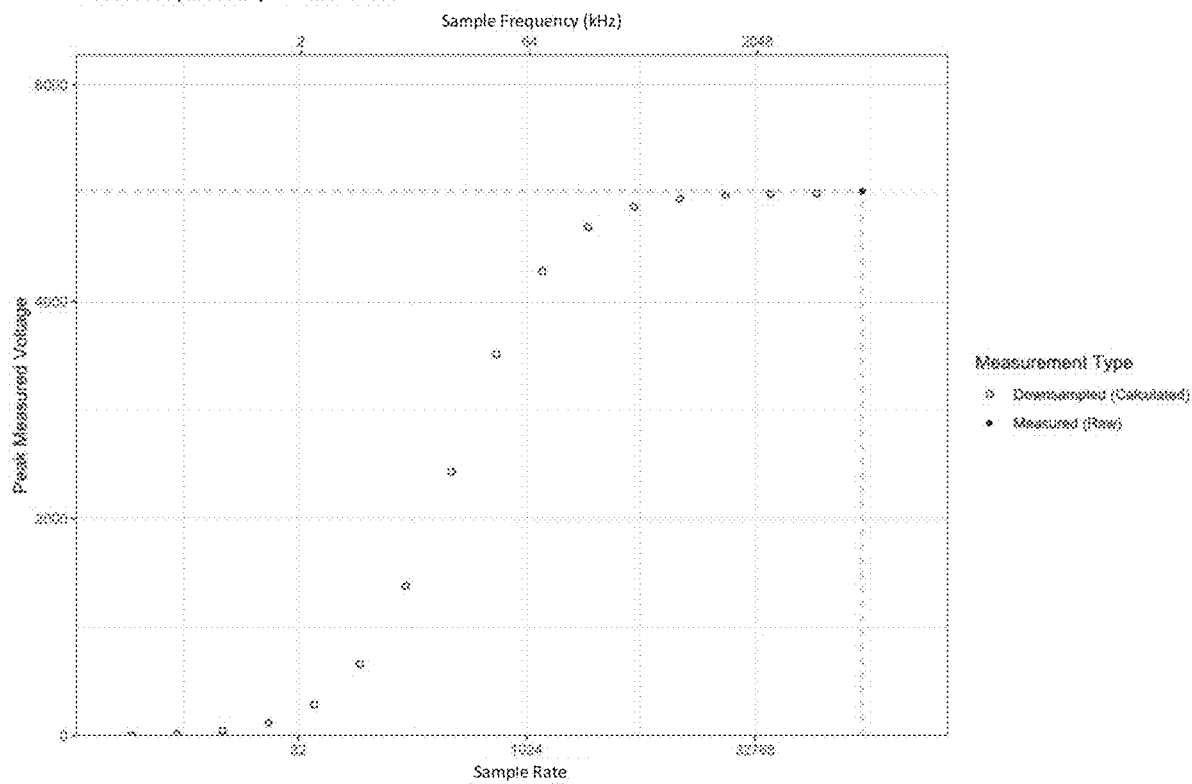
FIG. 6E illustrates an example downsampling model for the example transient event capture shown in FIG. 6D.

In this example, a model is constructed by plotting the transient event's peak magnitude (y-axis) versus the device sample rate (x-axis) for the three devices (Device A, Device B, and Device C) from the respective waveform captures shown in FIGS. 6, 6B, and 6D. These models are illustrated in FIGS. 6A, 6C, and 6E, respectively. In each case, the sampled data is reduced (e.g., downsampled, resampled, decimated, etc.) sequentially by a factor of '2' (or some other rate) and maximum event peak magnitude with its respective sample rate is again plotted in the model. This process is repeated until enough data points are available to describe (or model) the characteristic relationship of the event's magnitude versus the sample rate for a given IED. The original data point in the models shown in FIGS. 6A, 6C, and 6E (shown as solid circles) are the raw/measured value, while the and the subsequent data points in the same figures are calculated/downsampled values (shown as hollow circles).

For example, the measured (raw) maximum data point (468 volts) is plotted against the Device A's sample rate (32 S/C). It is shown in FIG. 6 as the single "measured (raw)" data point on the graph (i.e., "•"). Device A's sampled data set is then downsampled by a factor of '2' to create a new data set with a sample rate of 16 S/C (i.e., 32÷2). The new downsampled (calculated) data point (i.e., 234 volts) is plotted against Device A's downsampled rate (16 S/C). It is shown in FIG. 6 as the first "downsampled (calculated)" data point left of the single "measured (raw)" data point. Device A's sampled data set is then downsampled by a factor of '4' to create a new data set with a sample rate of 8 S/C (i.e., 32÷4). This newest downsampled (calculated) data point (i.e., 122 volts) is plotted against Device A's downsample rate (i.e., 8 S/C). It is shown in FIG. 6 as the second "downsampled (calculated)" data point left of the single "measured (raw)" data point. This process is repeated two additional times to produce data points for 4 S/C and 2 S/C. In this case, the graph produced by the resulting data points (i.e., shown in FIG. 6A) has the appearance of an exponential function.

The same process described in the paragraph above is also used to characterize the relationship between the maximum voltage and sample rate for the other two devices, Device B and Device C, and is shown in FIGS. 6C and 6E, respectively. The raw/measured and calculated/downsampled values determined for all three sample rates (i.e., 32 S/C, 512 S/C, and 10 MHz.) in this example are shown in Table 1 below:

TABLE 1

Measured and Calculated Data for FIGS. 1b, 2b, and 3b.*

| FIG. | Measured or Calculated | Sample Rate | Maximum Voltage |
|---|---|---|---|
| FIG. 1b | Raw/Measured | 32 | 468 Volts |
| FIG. 1b | Calculated | 16 | 234 Volts |
| FIG. 1b | Calculated | 8 | 122 Volts |
| FIG. 1b | Calculated | 4 | 64 Volts |
| FIG. 1b | Calculated | 2 | 33 Volts |
| FIG. 2b | Raw/Measured | 512 | 2,828 Volts |
| FIG. 2b | Calculated | 256 | 1,929 Volts |
| FIG. 2b | Calculated | 128 | 1,111 Volts |
| FIG. 2b | Calculated | 64 | 562 Volts |
| FIG. 2b | Calculated | 32 | 262 Volts |
| FIG. 2b | Calculated | 16 | 118 Volts |
| FIG. 2b | Calculated | 8 | 52 Volts |
| FIG. 2b | Calculated | 4 | 23 Volts |
| FIG. 2b | Calculated | 2 | 10 Volts |
| FIG. 3b | Raw/Measured | 166,667 | 5,020 Volts |
| FIG. 3b | Calculated | 83,333 | 5,000 Volts |
| FIG. 3b | Calculated | 41,667 | 4,995 Volts |
| FIG. 3b | Calculated | 20,833 | 4,982 Volts |
| FIG. 3b | Calculated | 10,417 | 4,950 Volts |
| FIG. 3b | Calculated | 5,208 | 4,871 Volts |
| FIG. 3b | Calculated | 2,604 | 4,685 Volts |
| FIG. 3b | Calculated | 1,302 | 4,278 Volts |
| FIG. 3b | Calculated | 651 | 3,517 Volts |
| FIG. 3b | Calculated | 326 | 2,436 Volts |
| FIG. 3b | Calculated | 163 | 1,379 Volts |
| FIG. 3b | Calculated | 81 | 663 Volts |
| FIG. 3b | Calculated | 41 | 289 Volts |
| FIG. 3b | Calculated | 20 | 120 Volts |
| FIG. 3b | Calculated | 10 | 49 Volts |
| FIG. 3b | Calculated | 5 | 20 Volts |
| FIG. 3b | Calculated | 3 | 8 Volts |

*Note:
Values may be rounded up or down to the nearest whole number.

The models shown in FIGS. 6A and 6C do not exhibit an upper knee; only a lower knee in the curve. FIG. 6E (captured the same event at a much higher sample rate) illustrates a sigmoid graph with two knees: a lower knee and an upper knee.

It is important to remember the intent of an IED is to capture/measure a high-speed transient event effectively enough to describe (or approximately describe) the 'true' characteristics of the event (e.g., peak amplitude, frequency components, rise time, duration, etc.). Once the process to create the data and model (as shown for the three sample rates in FIGS. 6A, 6C, and 6E, respectively) is complete, an analysis is performed of the data and/or model to determine whether the IED capturing the raw data was "properly configured" or "improperly configured" for the application. "Proper configuration" as defined herein denotes setting up an IED, that has sufficient hardware/software/firmware capabilities, to effectively capture and represent the 'true' characteristics of a high-speed transient event. Conversely, "improper configuration" denotes an IED with sufficient hardware/software/firmware capabilities to effectively capture and represent the 'true' characteristics of a high-speed event, yet is incumbered/constrained due to its settings.

Returning now to FIG. 4B, which was briefly discussed above in connection with FIG. 4, illustrated are three superimposed models derived from a different high-speed event with its own unique characteristic data. This figure will be used to illustrate various concepts associated with this invention. As before, three discrete IEDs were used to capture the same high-speed transient event (i.e., ≈6.2 kV transient) in this example. Each of the three IEDs has its own unique capabilities, sample rates, and other limitations/constraints. The first IED (green model) captured the high-speed transient event at a rate of 32 samples/cycle, the second IED (red model) captured the high-speed transient event at a rate of 512 samples/cycle, and the third IED (orange model captured the high-speed transient event at a rate of 166,666 samples/cycle.

The green model (32 samples/cycle) exhibits a peak amplitude of 849 volts, and is indicative of a model completely missing an upper knee. Per the first step described above, an indication would be provided to the end-user that the waveform capture appears to have been inadequately sampled by the IED. An additional step may be taken here to determine whether the IED may be configured to capture high-speed events using a faster sample rate; if so, the end-user would be notified and/or the IED may be automatically reconfigured to a faster sample rate.

The red model (512 samples/cycle) exhibits a peak amplitude of 3,029 volts, and is indicative of a model with a partial upper knee (i.e., a single data point to the right of the upper knee's inflection point). In this red model, the IED Specification Library indicates the IED capturing the waveform data has a constraint (i.e., an anti-aliasing filter designated by the vertical yellow line at the appropriate frequency). The occurrence of the red model's upper knee proximate to the location of the IED's anti-aliasing filter indicates the filter is likely impacting the IED's ability to accurately measure the higher frequency components (including the correct/approximately correct amplitude of the transient event) associated with the captured event. In this case, the end-user would be provided an indication the waveform capture was not adequately captured by the IED. The IED Specification Library may indicate the IED allows dynamic anti-aliasing filtering adjustments (i.e., moving the anti-aliasing filter frequency), so an indication may be sent to the end-user informing them to move the anti-aliasing filter to a high frequency (if possible) to allow for adequate high-speed voltage/current event captures.

The orange model (166,666 samples/cycle) exhibits a peak amplitude of 6,175 volts, and is indicative of a model with a complete/full upper knee (i.e., several samples to the right of the upper knee's inflection point). The orange model is indicative of a sigmoid with no IED constraints proximate to the upper knee. The Nyquist frequency (which directly provides the sample rate limitations for the event) based on a sample rate of 166,666 samples/cycle, is slightly less than 5 MHz. Using the model, it is possible to derive an optimal sample rate that provides a reasonable approximation of the event's amplitude. This optimal sample rate is determined when the orange line approximately reaches a stable (flat) value. In this example, the sigmoid model's stable value to the right of the upper knee occurs between the $6^{th}$ and $7^{th}$ data point, counting from the right. If a line is drawn vertically down to the x-axis from the first stable value (i.e., between the $6^{th}$ and $7^{th}$ downsampled/resampled/decimated data point), it crosses at approximately 3,900 samples per cycle (which corresponds to 234.36 kHz.). A commercially available IEDs with a sample rate of at least 235 kHz should have been able to appropriately capture this particular event.

FIG. 4B provides additional information regarding the quality of the sample rate, for example, whether the signal was undersampled, optimally sampled, or oversampled. Undersampled means the sample rate of the IED was too low to adequately/acceptably digitally represent the analog signal. Optimally sampled means the sample rate of the IED was reasonable/acceptable/adequate to digitally represent the analog signal. Oversampled means the sample rate of the IED was more than reasonably/acceptably/adequately digitally able to represent the analog signal. The goal is to achieve at least optimal sampling (oversampling is very acceptable) to provide beneficial results to the end-user. Conversely, undersampling may provide results that can be misleading as discussed earlier in the specification.

The final consideration described in FIG. 46 is the dynamic range of an IED (blue line). The magnitude of an event captured by all IEDs is constrained/limited, and the analog signal begins to saturate the digital meter at that threshold. The dynamic range of an IED is inherently determined by its design, so it is important to understand this constraint/limitation with analog signals of excessive magnitude. The IED Constraint Specification Library may provide the specific dynamic range of an array of IEDs or the dynamic range of an IED may be entered manually by the end-user, person commissioning the system, and so forth.

It is understood that there are many other features and extensions of this invention to be considered. For example, the following includes a brief list of features and extensions:

Many new metrics may be provided with each discrete high-speed event capture. For example, captured vs. not captured percentages, amplitude comparisons, configured vs. mis-configured percentages, impactful vs. non-impactful high-speed event percentages, etc.

Historical data may be used to provide trends of each and every metric.

Historical data may be used to validate efficacy of changes to configurations, changes of IEDs, and other updates.

Analyses may include determining the capability of capturing high-speed events at certain times of day (TOD). It is possible to better capture certain event types (e.g., capacitor switching events) that occur at specific times, but more difficult to capture other event types (e.g., arcing) that are more random. This could assist in troubleshooting issues.

Faster events are more difficult to capture than slower events. Each respective event type also has its own unique causes. Leveraging the knowledge of what event types may be captured by which IED types may be useful for troubleshooting issues.

Comparing high-speed event characteristics from at least two IEDs to better understand each discrete IED's capabilities (i.e., leveraging data from one IED to assess a second IED). This is useful for ensuring proper configuration, IED limitations, and building on/appending to the IED Specification Library. For example, one or more IEDs incapable of adequately capturing event data may be missing relevant information critical to determining a root cause.

Analyzing the data provided from this invention at discrete IEDs may be used to assess the areas of the electrical system/EPMS that have adequate high-speed capture capabilities, and which do not. For example, the assessment may determine, or be used to determine, optimal placement of metering devices in an electrical system for a particular customer based on a variety of factors. The factors may include, for example, quantity and types of metering devices currently in the electrical system, types of events the customer is most interested in detecting, budget constraints, etc. Recommendations relating to the optimal placement may be provided to the customer.

Providing metrics from discrete IEDs to indicate their efficacy for capturing high-speed events. This can be extended to processes, zones, and system-wide as needed.

EPMS and electrical system analysis can be useful for mitigation equipment sales and pull-through sales for mid/high-end IED products.

Evaluation and identification of mis-configured IEDs may indicate systematic configuration issues within the EPMS.

Improved reporting of EPMS limitations to end-users.

Identification of sales opportunities (both IEDs and other equipment) through cloud-connected applications (e.g., Power Advisor by Schneider Electric).

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., power monitoring system applications) but rather, may be useful in substantially any application where it is desired to improving identification of issues associated with detecting anomalous conditions in electrical systems. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method to automatically identify metering constraints of one or more Intelligent Electronic Devices (IEDs) in an electrical system, comprising:
    capturing at least one energy-related waveform using at least one of the IEDs in the electrical system;
    processing electrical measurement data from, or derived from, the at least one energy-related waveform to detect a high-speed event by identifying anomalous characteristics associated with the high-speed event in the electrical system, wherein the high-speed event is a transient event;
    in response to identifying anomalous characteristics in the electrical measurement data, building an event constraint model based on or by using the identified anomalous characteristics;
    analyzing the event constraint model to determine if the at least one energy-related waveform is being adequately captured by the at least one of the IEDs to enable detection of the high-speed event, including determining the capturing inadequacy is due to a lack of information about the energy-waveform, wherein the lack of information is due to the high speed and transience of the high-speed event; and
    in response to determining the at least one energy-related waveform is not adequately captured, taking one or more actions to address the capturing inadequacy, including taking the one or more actions to enable capturing the at least one energy-related waveform to obtain the information about the energy-waveform associated with the high-speed event that was lacking.

2. The method of claim 1, wherein the at least one energy-related waveform includes at least one of: a voltage waveform, a current waveform, and another waveform and/or data derived from the voltage waveform and/or the current waveform.

3. The method of claim 2, wherein the voltage waveform and the current waveform are at least one of: a single-phase voltage and current waveform, and a three-phase voltage and current waveform.

4. The method of claim 1, wherein the at least one energy-related waveform is associated with at least one load in the electrical system.

5. The method of claim 1, wherein the electrical measurement data is processed on at least one of: the at least one of the IEDs, a cloud-based system, on-site/edge software, a gateway, and another head-end system.

6. The method of claim 5, wherein the cloud-based system, on-site/edge software, the gateway, and the other head-end system are communicatively coupled to the at least one of the IED s.

7. The method of claim 1, wherein the anomalous characteristics identified in the electrical system include characteristics indicative of at least one of a transient voltage and transient current event/conditions in the electrical system.

8. The method of claim 7, wherein the characteristics indicative of at least one of the transient voltage and transient current event/conditions include at least one of: (a) sudden, non-power frequency changes in voltage, current, or both voltage and current that is unidirectional in polarity; and (b) sudden non-power frequency change in voltage, current, or both voltage and current that is bidirectional in polarity.

9. The method of claim 7, further comprising: in response to identifying at least one of the transient voltage and transient current event/condition in the electrical system, characterizing the at least one of the transient voltage and transient current event/condition based on at least one of: crest (or peak) value of the transient, area of the transient, maximum rate of rise of the transient, duration on the transient, periodicity, and associated frequencies related to the transient.

10. The method of claim 1, wherein the one or more actions taken to address the capturing inadequacy include: communicating the capturing inadequacy to an end-user, equipment manufacturer, services team and/or other interested individual or party.

11. The method of claim 10, wherein the communication includes at least one of: a report, a text, an email, appendant to an alarm, an audible communication, and a communication on an interface of a screen/display.

12. The method of claim 10, wherein the communication provides actionable recommendations for responding to the capturing inadequacy.

13. The method of claim 12, wherein the actionable recommendations include at least one of: recommendations for adjusting one or more parameters associated with the at least one of the IEDs to address the capturing inadequacy, and recommendations indicating at least one IED other than the at least one of the IEDs that is capable of adequately capturing the at least one energy-related waveform to enable detection of the high-speed event as indicated by an event constraint model that can be built based on anomalous characteristics that can be identified in electrical measurement data that can be processed or derived from the at least one energy-related waveform.

14. The method of claim 13, wherein the one or more parameters include sample rate of the at least one of the IEDs.

15. The method of claim 13, wherein the at least one other IED other than the at least one of the IEDs has a higher sample rate capability than the at least one of the IEDs capturing the at least one energy-related waveform.

16. The method of claim 10, further comprising: prior to communicating the capturing inadequacy, determining if it is necessary to communicate the capturing inadequacy.

17. The method of claim 16, wherein the determination if it is necessary to communicate the capturing inadequacy is made based on one or more factors, the factors including if the anomalous characteristics associated with the captured energy-related waveform may be impactful to the customer's installation.

18. The method of claim 1, wherein the one or more actions taken to address the capturing inadequacy include: automatically adjusting one or more parameters associated with the at least one of the IEDs to address the capturing inadequacy.

19. The method of claim 18, wherein the one or more parameters include sample rate of the at least one of the IEDs.

20. The method of claim 1, further comprising:
in response to determining the at least one energy-related waveform is adequately captured, providing an indication of the capturing adequacy.

21. The method of claim 20, wherein the indication is provided in at least one of: a report, a text, an email, an alarm, an audible communication, and a communication on an interface of a screen/display.

22. The method of claim 1, wherein the event constraint model is built using at least one of data reduced by at least one of downsampling, resampling and decimation, real data, and extrapolated data from the electrical measurement data used to identify the anomalous characteristics.

23. The method of claim 1, wherein analyzing the event constraint model to determine if the at least one energy-related waveform is being adequately captured by the at least one of the IEDs, includes: analyzing the event constraint model to determine if the at least one energy-related waveform is being adequately sampled by the at least one of the IEDs to enable detection of the high-speed event when taking into account the high speed and transience of the high-speed event and storage space of the at least one of IEDs.

24. The method of claim 23, wherein taking one or more actions to address the capturing inadequacy includes: taking one or more actions to address and/or respond to the sampling inadequacy.

25. The method of claim 24, wherein the one or more actions taken to address the sampling inadequacy include: adjusting the sample rate of the at least one IEDs.

26. A system to automatically identify metering constraints of one or more Intelligent Electronic Devices (IEDs) in an electrical system, comprising:
at least one processor;
at least one memory device coupled to the at least one processor, the at least one processor and the at least one memory device configured to:
process electrical measurement data from, or derived from, at least one energy-related waveform captured using at least one of the IEDs in the electrical system in real-time, pseudo-real time, or historically to detect a high-speed event by identifying anomalous characteristics in the electrical system, wherein the high-speed event is a transient event;
in response to identifying anomalous characteristics in the electrical measurement data, build an event constraint model based on or by using the identified anomalous characteristics;
analyze the event constraint model to determine if the at least one energy-related waveform is being adequately captured by the at least one of the IEDs to enable detection of the high-speed event, including determining the capturing inadequacy is due to a lack of information about the energy-waveform, wherein the lack of information is due to the high speed and transience of the high-speed event; and
in response to determining the at least one energy-related waveform is not adequately captured, take one or more actions to address the capturing inadequacy, including taking the one or more actions to enable capturing the at least one energy-related waveform to obtain the information about the energy-waveform associated with the high-speed event that was lacking.

\* \* \* \* \*